United States Patent
Jambunathan et al.

(10) Patent No.: US 11,101,268 B2
(45) Date of Patent: Aug. 24, 2021

(54) TRANSISTORS EMPLOYING NON-SELECTIVE DEPOSITION OF SOURCE/DRAIN MATERIAL

(71) Applicant: INTEL CORPORATION, Santa Clara, CA (US)

(72) Inventors: Karthik Jambunathan, Hillsboro, OR (US); Scott J. Maddox, Hillsboro, OR (US); Ritesh Jhaveri, Hillsboro, OR (US); Pratik A. Patel, Portland, OR (US); Szuya S. Liao, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 16/473,891

(22) PCT Filed: Mar. 30, 2017

(86) PCT No.: PCT/US2017/025012
§ 371 (c)(1),
(2) Date: Jun. 26, 2019

(87) PCT Pub. No.: WO2018/182617
PCT Pub. Date: Oct. 4, 2018

(65) Prior Publication Data
US 2019/0355721 A1    Nov. 21, 2019

(51) Int. Cl.
*H01L 29/78*      (2006.01)
*H01L 29/66*      (2006.01)
(Continued)

(52) U.S. Cl.
CPC ........ *H01L 27/0886* (2013.01); *H01L 21/762* (2013.01); *H01L 21/823431* (2013.01);
(Continued)

(58) Field of Classification Search
CPC .............. H01L 27/0886; H01L 21/762; H01L 21/823431; H01L 29/66795; H01L 29/785
(Continued)

(56) References Cited

U.S. PATENT DOCUMENTS

2011/0312147 A1   12/2011   Harame et al.
2013/0200458 A1    8/2013   Anderson et al.
(Continued)

FOREIGN PATENT DOCUMENTS

KR    20130006674 A    1/2013
WO    2018182617 A1   10/2018

OTHER PUBLICATIONS

International Search Report and Written Opinion received for PCT Application No. PCT/US2017/025012, dated Dec. 26, 2017. 11 pages.
(Continued)

*Primary Examiner* — Didarul A Mazumder
(74) *Attorney, Agent, or Firm* — Schwabe, Williamson & Wyatt, P.C.

(57) ABSTRACT

Techniques are disclosed for forming transistors employing non-selective deposition of source and drain (S/D) material. Non-selectively depositing S/D material provides a multitude of benefits over only selectively depositing the S/D material, such as being able to attain relatively higher dopant activation, steeper dopant profiles, and better channel strain, for example. To achieve selectively retaining non-selectively deposited S/D material only in the S/D regions of a transistor (and not in other locations that would lead to electrically shorting the device, and thus, device failure), the techniques described herein use a combination of dielectric isolation structures, etchable hardmask material, and selective etching processes (based on differential etch rates between monocrystalline semiconductor material, amor-
(Continued)

phous semiconductor material, and the hardmask material) to selectively remove the non-selectively deposited S/D material and then selectively remove the hardmask material, thereby achieving selective retention of non-selectively deposited monocrystalline semiconductor material in the S/D regions.

18 Claims, 17 Drawing Sheets

(51) Int. Cl.
  *H01L 27/08* (2006.01)
  *H01L 27/088* (2006.01)
  *H01L 21/762* (2006.01)
  *H01L 21/8234* (2006.01)
  *H01L 29/06* (2006.01)

(52) U.S. Cl.
  CPC .... *H01L 29/0649* (2013.01); *H01L 29/66795* (2013.01); *H01L 29/785* (2013.01)

(58) Field of Classification Search
  USPC .......................................... 257/365; 438/284
  See application file for complete search history.

(56) References Cited

U.S. PATENT DOCUMENTS

| | | | |
|---|---|---|---|
| 2013/0248927 A1* | 9/2013 | Wu | H01L 29/41791 257/190 |
| 2014/0203338 A1* | 7/2014 | Kelly | H01L 29/0653 257/288 |
| 2014/0264597 A1 | 9/2014 | Kim et al. | |
| 2014/0335665 A1 | 11/2014 | Basu et al. | |
| 2015/0069473 A1* | 3/2015 | Glass | H01L 29/66795 257/288 |
| 2015/0069474 A1* | 3/2015 | Ching | H01L 21/2253 257/288 |
| 2015/0303284 A1* | 10/2015 | Basker | H01L 21/31111 257/288 |
| 2016/0293760 A1 | 10/2016 | Glass et al. | |
| 2016/0314976 A1* | 10/2016 | Guo | H01L 21/762 |
| 2017/0005005 A1* | 1/2017 | Chen | H01L 21/823431 |

OTHER PUBLICATIONS

International Preliminary Report on Patentability received for PCT Application No. PCT/US2017/025012, dated Oct. 10, 2019. 8 pages.

* cited by examiner

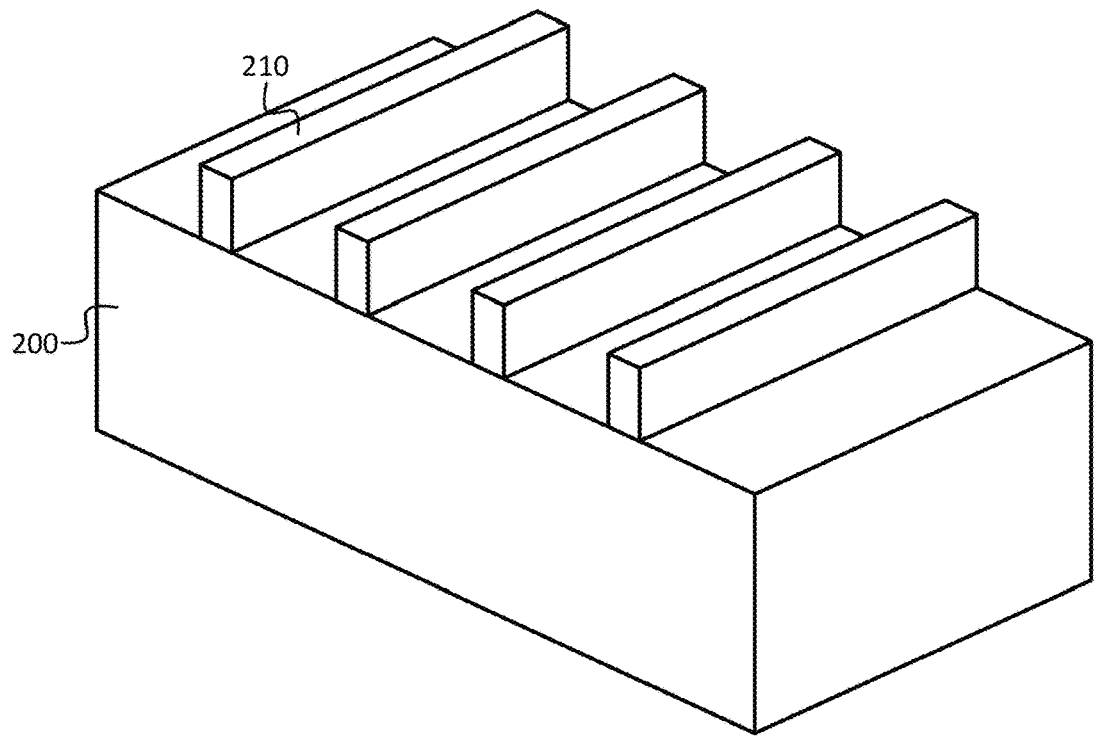
FIG. 2A
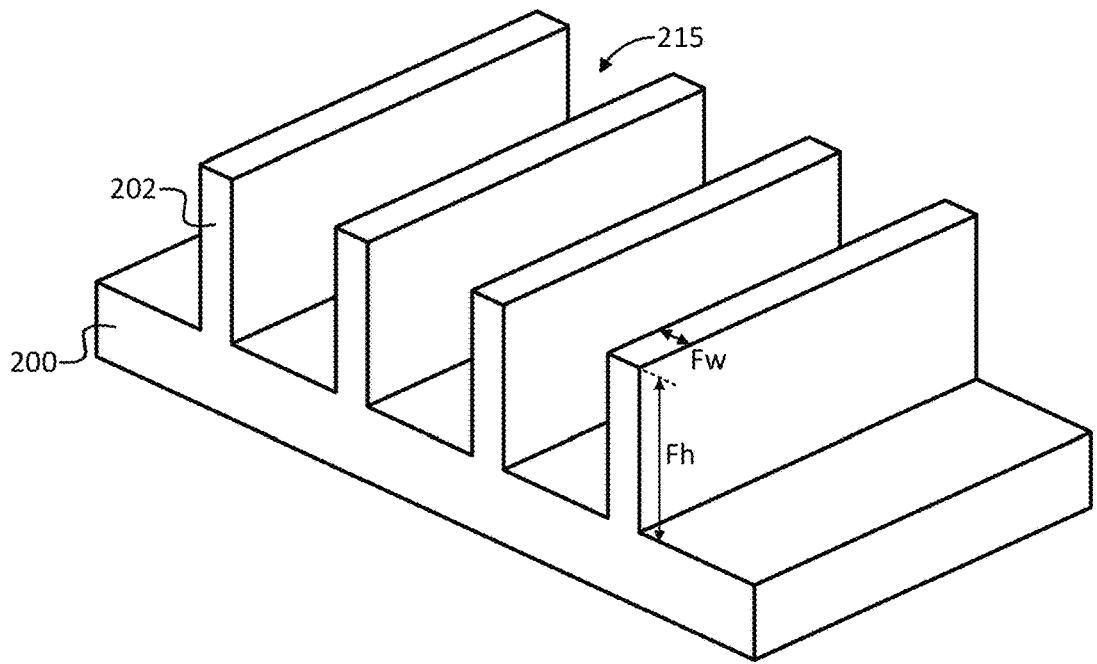
FIG. 2B
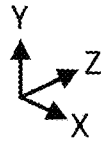

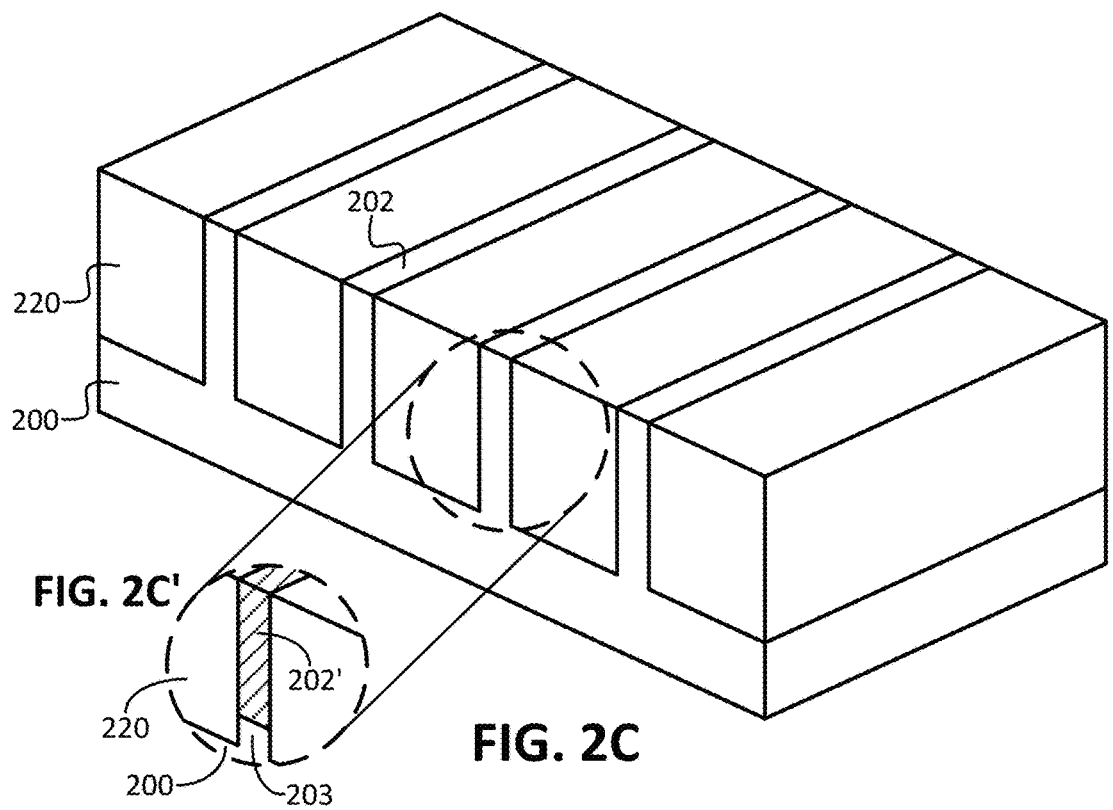
FIG. 2C
FIG. 2C'
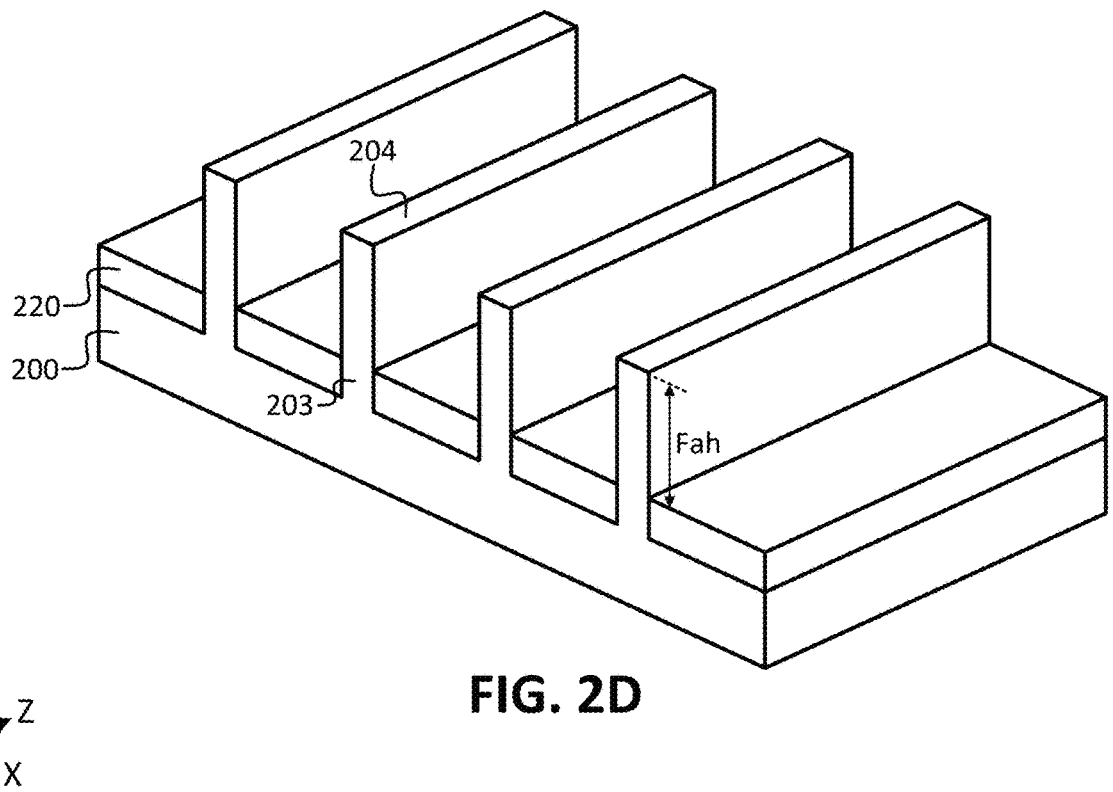
FIG. 2D

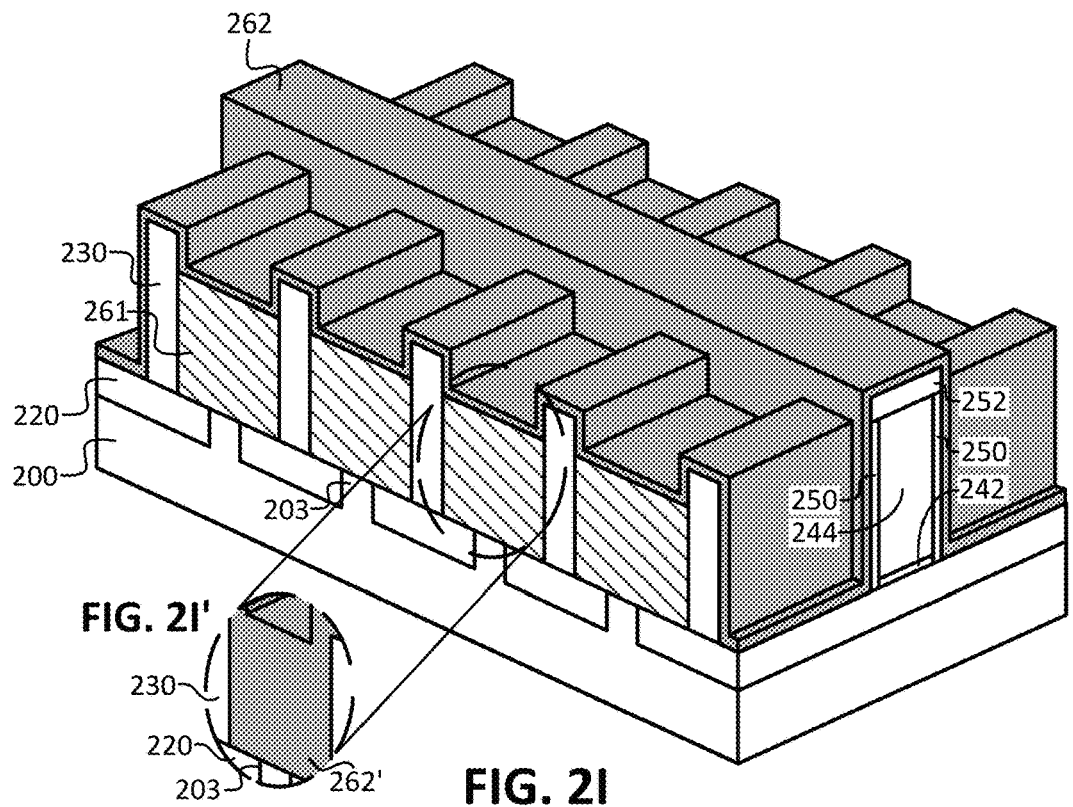
FIG. 2I'
FIG. 2I
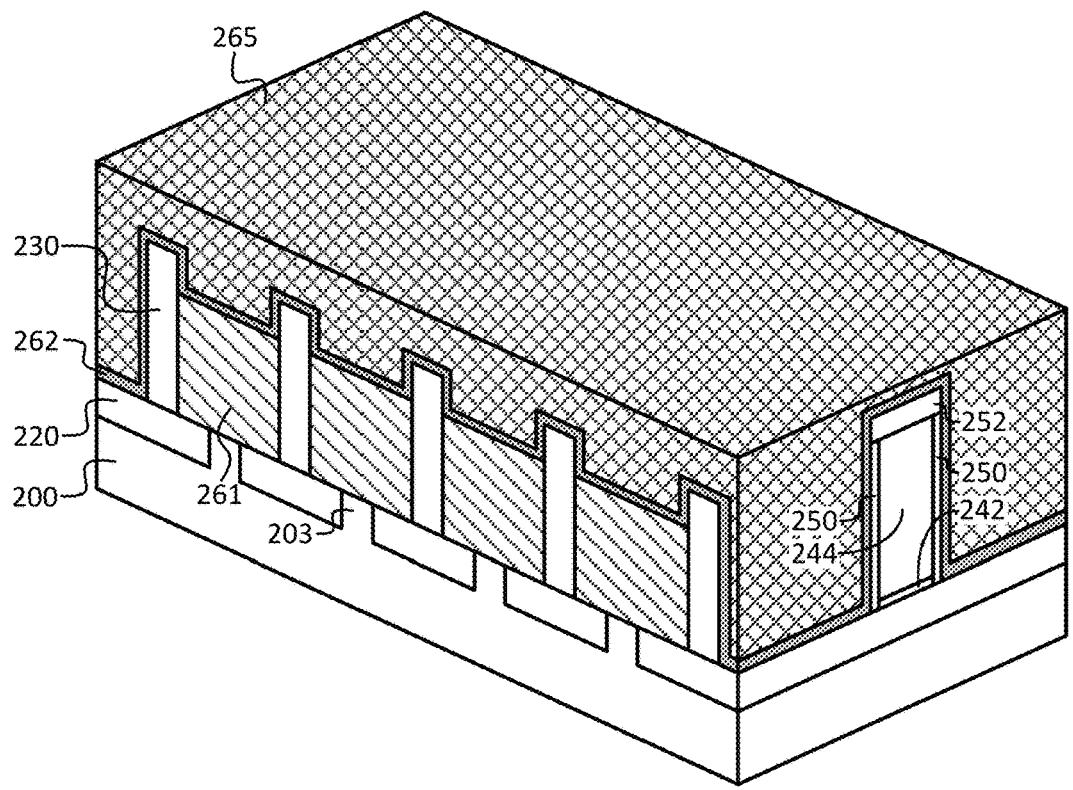
FIG. 2J

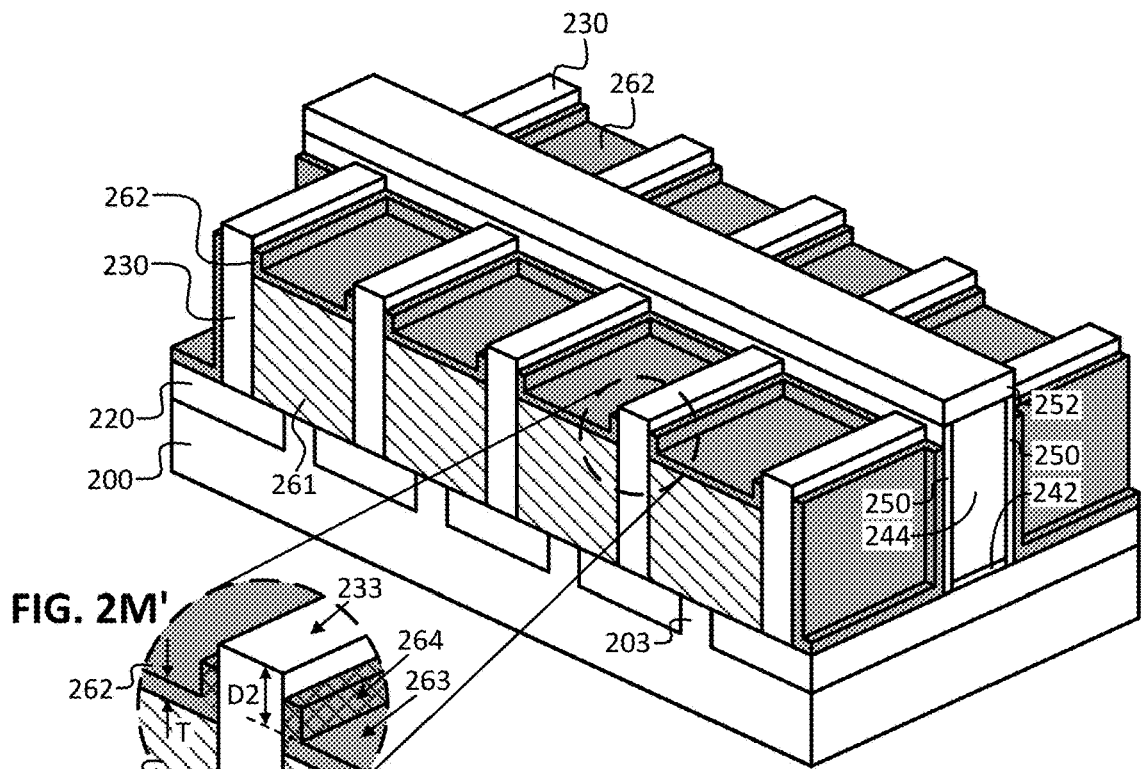
FIG. 2M'
FIG. 2M
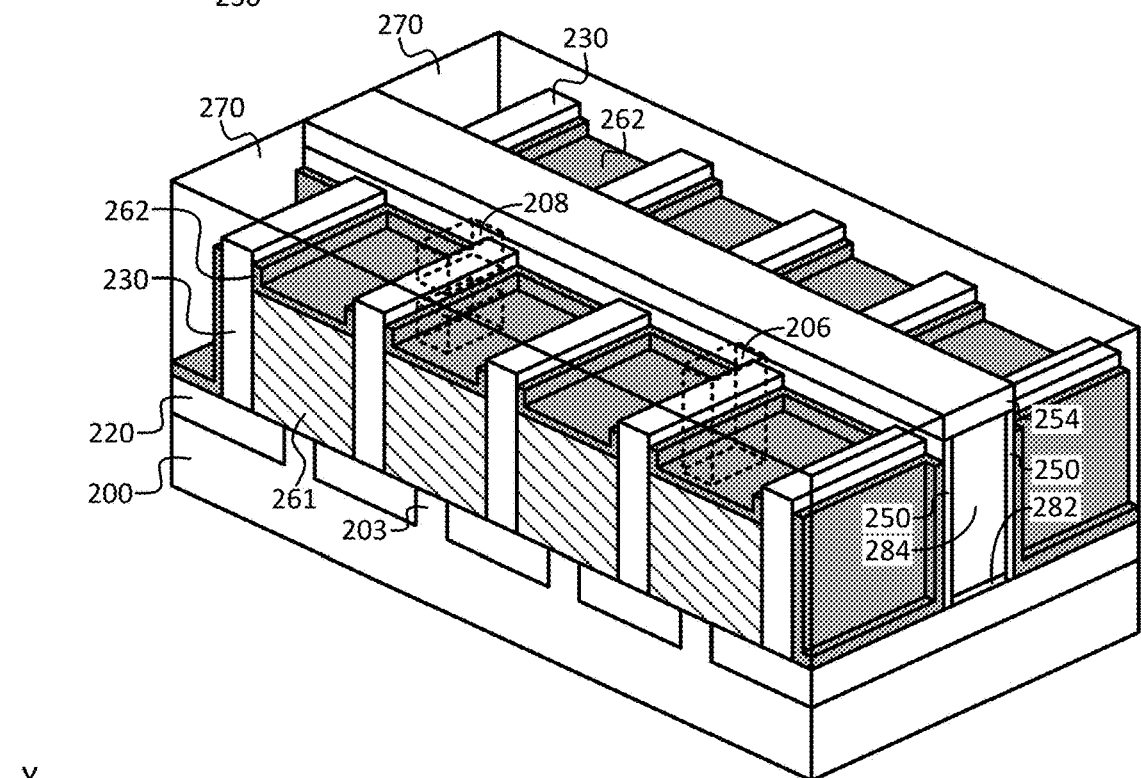
FIG. 2N

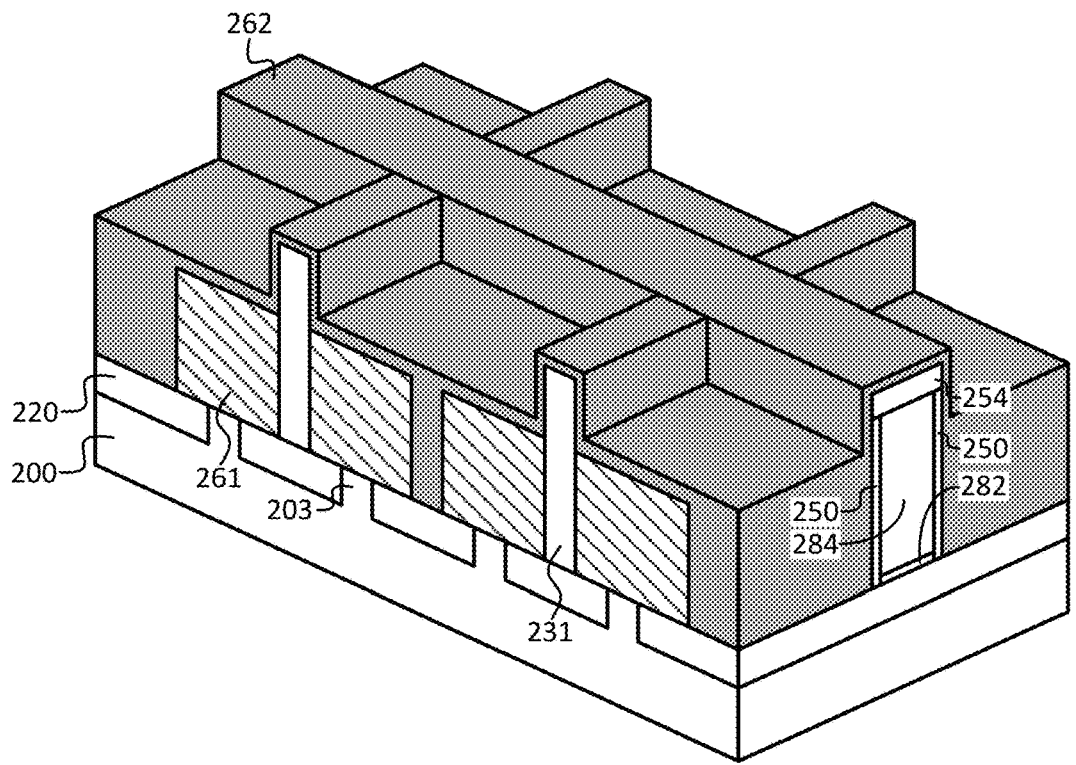
FIG. 4G
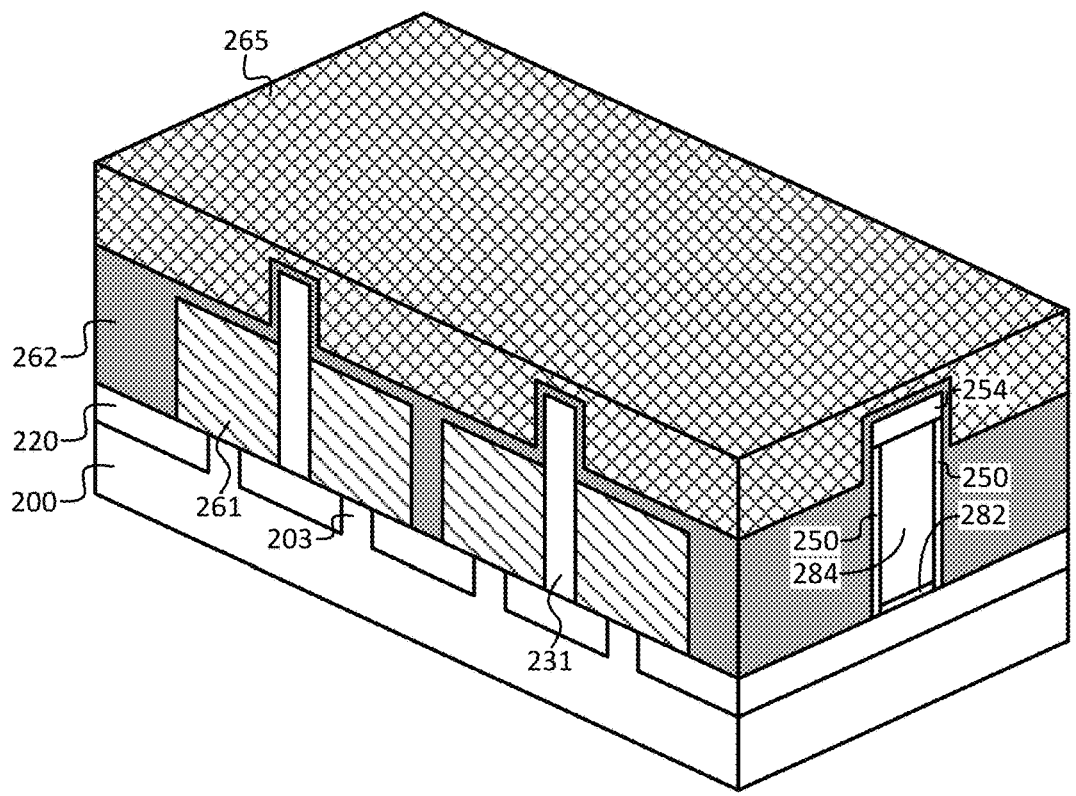
FIG. 4H
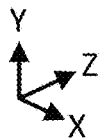

TRANSISTORS EMPLOYING NON-SELECTIVE DEPOSITION OF SOURCE/DRAIN MATERIAL

CROSS-REFERENCE TO RELATED APPLICATIONS

This patent application is a U.S. National Phase Application under 35 U.S.C. § 371 of International Application No. PCT/US2017/025012, filed on Mar. 30, 2017, the entire contents of which is hereby incorporated by reference herein.

BACKGROUND

Semiconductor devices are electronic components that exploit the electronic properties of semiconductor materials, such as silicon (Si), germanium (Ge), and gallium arsenide (GaAS). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known, more generally, as metal-insulator-semiconductor FETs (MIS-FETs) or insulated-gate FETs (IGFETs). Complementary MOS (CMOS) structures use a combination of p-channel MOSFET (p-MOS) and n-channel MOSFET (n-MOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top surface of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top surface of the fin). A nanowire transistor (sometimes referred to as a gate-all-around (GAA) or nanoribbon transistor) is configured similarly to a fin-based transistor, but instead of a finned channel region where the gate is on three portions (and thus, there are three effective gates), one or more nanowires are used for the channel region and the gate material generally surrounds each nanowire.

BRIEF DESCRIPTION OF THE DRAWINGS

FIGS. 4A-4L illustrate example structures that are formed when carrying out the method of FIG. 1A, in accordance with some embodiments.

Figure 1A:
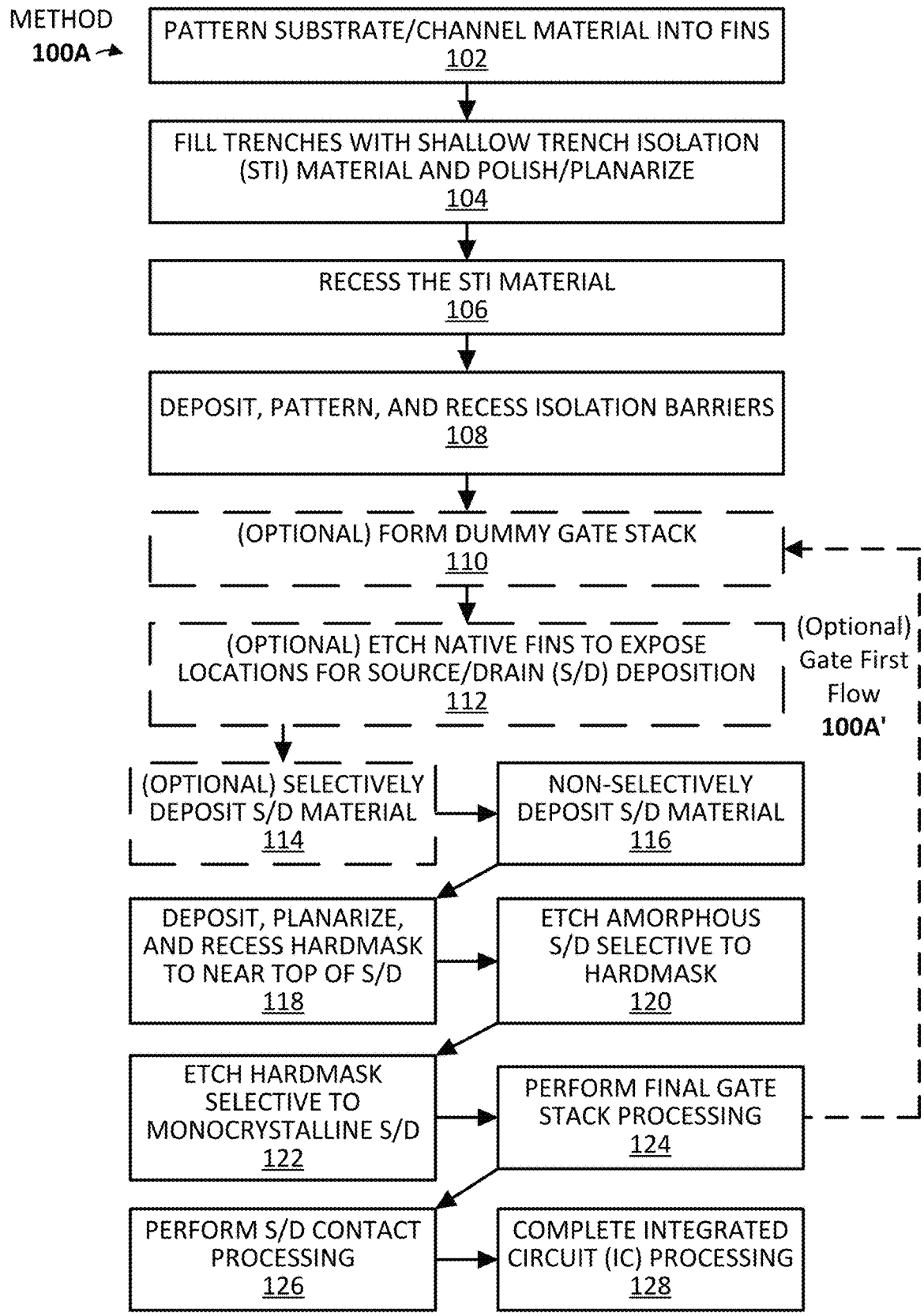
FIGS. 1A-B illustrate methods of forming an integrated circuit (IC) including at least one transistor employing non-selectively deposited source/drain (S/D) material, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is primarily provided to assist in visually differentiating the different features. In short, the figures are provided merely to show example structures.

DETAILED DESCRIPTION

Standard field-effect transistor (FET) processing, such as for forming non-planar transistors, sometimes requires selective deposition of the source and drain (S/D) region material with a high dopant concentration (e.g., of at least 1E18 atoms per cubic centimeter), to effectively form the transistor devices. However, such requirements place a significant restriction on the choice and range of materials that can be used as well as the deposition techniques. Non-selective deposition of S/D material would provide more effective S/D regions compared to S/D regions formed using selective deposition. For instance, transistors formed using such non-selective S/D deposition may be able to achieve relatively higher dopant activation, better channel strain, steeper dopant profiles, and other performance benefits. In more detail, selective deposition of S/D semiconductor material typically results in a small percentage of the included dopant being active, such as only 10-20% being active, which is a significant device performance limiter. To provide an example, if semiconductor material dopant is included in a given S/D region at a concentration of 1E21 atoms per cubic centimeter (cm), and the selective deposition techniques used result in only 10% of the dopant being active, the dopant essentially has an active concentration of only 1E20 atoms per cubic cm. The inactive dopant issue is particularly significant for n-channel group IV semiconductor material transistors (e.g., Si, Ge, or SiGe n-MOS) where the S/D material is doped with n-type dopant (e.g., phosphorous, arsenic, etc.). In contrast, non-selective deposition of the S/D material can achieve up to 100% of the included dopant being active and can also achieve relatively higher included dopant concentrations. However, non-selective deposition of S/D material also results in the presence of conductive S/D material formed everywhere it is deposited, resulting in S/D material in non-S/D regions of the integrated circuit, thereby resulting in electrical shorting and device failure. Therefore, non-selective deposition of S/D material during standard transistor fabrication is problematic and generally to be avoided.

Thus, and in accordance with numerous embodiments of the present disclosure, techniques are provided for forming transistors employing non-selective deposition of source and drain (S/D) material. The formation of S/D semiconductor material via selective deposition in S/D regions typically results in that semiconductor material epitaxially growing with a monocrystalline structure primarily in the S/D regions (e.g., from one or more monocrystalline semiconductor material seeding surfaces). Note that in some cases, insignificant amounts (e.g., a few atoms) of amorphous or polycrystalline semiconductor material may form from other non-semiconductor material surfaces during selective deposition of such S/D semiconductor material. However, when using non-selective deposition techniques of S/D semiconductor material, the semiconductor material significantly forms on all exposed surfaces in the deposition area, resulting in S/D material forming, for example, on exposed insulator material surfaces as well as exposed semiconductor material surfaces outside the target S/D regions. In such non-selective situations, the semiconductor material formed on exposed insulator surfaces has an amorphous or polycrystalline structure. As will be apparent in light of this disclosure, the techniques described herein achieve effective use of the non-selective deposition of S/D semiconductor material through the use of isolation structures of insulator/dielectric material, hardmask processing, and selective etching to remove the non-selectively deposited S/D material in the non-S/D regions, in accordance with some embodiments. Therefore, the techniques described herein combine the benefits of non-selectively deposited S/D semiconductor material (e.g., relatively higher dopant activation, steeper dopant profiles, better channel strain, etc.) with the requirements that the S/D semiconductor material only remain in the S/D regions (so as to not electrically short the transistor device).

Recall that employing only selectively deposited S/D material limits the ultimate performance of the fabricated transistors due to the selectively deposited semiconductor material having limitations with respect to, for example, relatively shallower dopant profiles (e.g., cannot include as much dopant in a given semiconductor material), relatively decreased dopant activation (e.g., only a portion of the included dopant is active in the semiconductor material), and relatively lower channel strain compared to non-selectively deposited semiconductor material. Therefore, according to an embodiment of the present disclosure, non-selectively deposited S/D material is employed to provide relative increases in dopant profiles (e.g., how much dopant can be chemically included in a given semiconductor material), dopant activation (e.g., the portion of the included dopant that is active in a given semiconductor material), and channel strain (e.g., advantageous strain applied to the adjacent and corresponding channel region). For instance, in some embodiments, employing non-selectively deposited S/D material as variously described herein allow for at least 1.5, 2, 2.5, 3, 3.5, 4, 4.5, 5, 6, 7, 8, 9, 10, 15, or 20 times greater included dopant concentrations in a given semiconductor material as compared to selectively depositing that semiconductor material. For example, for the deposition of a given semiconductor material, selective deposition of that semiconductor material may only be able to achieve maximum dopant concentrations of 1E20 atoms per cubic cm, but non-selective deposition of that semiconductor material may be able to achieve maximum dopant concentrations of at least 1E21 atoms per cubic cm, depending on the given semiconductor material, which is at least a 10 times greater increase in dopant concentration.

Further, in some embodiments, employing non-selectively deposited S/D material as variously described herein may allow for the included dopant in a given semiconductor material to be active at higher percentages, such as at percentages that are at least 1.5, 2, 2.5, 3, 3.5, 4, 4.5, 5, 6, 7, 8, 9, 10, 15, or 20 times greater as compared to selectively depositing that semiconductor material. For example, for the deposition of a given semiconductor material, selective deposition of that semiconductor material may achieve a dopant concentration of 1E20 atoms per cubic cm where only 10% of the included dopant is active, which results in an actual effective dopant concentration of 1E19 atoms per cubic cm. In such an example case, if the semiconductor material were non-selectively deposited with the same included dopant concentration of 1E20 atoms per cubic cm, the non-selectively deposited semiconductor material may be able to achieve at least 90% activation (and even up to 100%), such that at least 9E19 atoms per cubic cm were actually active (and even up to the full 1E20 atoms per cubic cm) which is at least a 9 times greater increase in dopant activation. Further still, in some embodiments, employing the non-selectively deposited S/D material as variously described herein may allow for the non-selectively deposited semiconductor material to apply at least 1.25, 1.5, 1.75, 2, 2.5, 3, 3.5, 4, 4.5, 5, 6, 7, 8, 9, or 10 times greater strain (e.g., tensile or compressive, as desired) to a corresponding channel region to improve mobility of that channel region and thereby improve device performance. Numerous benefits of employing non-selectively deposited S/D material will be apparent in light of this disclosure.

In some embodiments, the techniques include an up-front approach where a layer of material to be used in the channel region is formed into fins and isolation structures are formed between the neighboring or adjacent fins as desired. Thus, when the fins are formed into final regions of transistors (channel regions, source regions, and drain regions), a given isolation structure is located between the two transistors (e.g., between the two channel regions as well as between the respective S/D regions of the two transistors). In some such embodiments, the isolation structures are formed to be relatively taller than the semiconductor material fins, such that the top surfaces of the isolation structures (which may also be fin-shaped) are relatively higher than the top surfaces of the semiconductor material fins. This is to allow for subsequent processing, such as for enabling selectively retaining non-selectively deposited S/D material in only the desired S/D regions. For instance, in some embodiments, the top surface of a given isolation structure may be higher than the top surface of an adjacent semiconductor material fin (and/or the top surface of the monocrystalline semiconductor material included in the final S/D region) by 10-500 nm (or a subrange of 10-25, 10-50, 10-75, 10-100, 10-200, 10-300, 10-400, 25-50, 25-75, 25-100, 25-200, 25-300, 25-400, 25-500, 50-75, 50-100, 50-200, 50-300, 50-400, 50-500, 100-300, 100-500, or 200-500 nm), or any other suitable amount or range as can be understood based on this disclosure. In some embodiments, the top surface of a given isolation structure may be at least 10, 15, 20, 25, 30, 35, 40, 45, 50, 60, 70, 80, 90, 100, 150, 200, or 250 nm higher than the top surface of an adjacent semiconductor material fin (and/or the top surface of the monocrystalline semiconductor material included in the final S/D region), or any other suitable threshold value as can be understood based on this disclosure.

As will be appreciated, reference to "top" herein does not necessarily refer to the absolute top-most point of a given surface. Rather, top is intended to refer to any point along a top surface of a given area or field of material (whether that material be insulator material or semiconductor material or some other material). Moreover, in some cases, note that a given material may be deposited in multiple areas of a given transistor structure, and therefore have multiple top surfaces. For instance, in one example embodiment, the isolation structures and overlying interlayer dielectric (ILD) material may both include, e.g., silicon dioxide. In such cases, the silicon dioxide might look like a continuous layer (such that it is difficult to observe where the isolation structure ends and the ILD begins). Further note in such cases that the silicon dioxide in the isolation structure may be deposited by a first method (e.g., chemical vapor deposition), and the silicon dioxide in the ILD may be deposited by a second method (e.g., growth by thermal oxidation). In such a case, identification of a given isolation structure may be assisted by observing amorphous or polycrystalline material formed thereon (e.g., directly on at least a portion of the side of the isolation structure) and/or based on the given isolation structure extending under the gate stack, for example. In any event, reference to the top surface of the isolation structure simply refers to the isolation structure itself and not other insulator material structures.

In other embodiments, the techniques include forming the isolation structures during S/D contact loop processing, such as when forming S/D contact trenches, for example. In such approaches or in the aforementioned up-front approach, the techniques can be employed using gate last or gate first process flows. Further, in some embodiments, a pair (or set) of isolation structures can help to electrically isolate one or more transistors, and as such, the isolation structures may be considered isolation barriers, for example. In some embodiments, a given S/D region may include both selectively deposited S/D semiconductor material and non-selectively deposited S/D semiconductor material, such that the interface between the two material layers is below the top surface of adjacent isolation structures (or otherwise below the field of the nearest isolation structure(s) which the given S/D region is adjacent). In some embodiments, a given isolation structure may include any suitable electrical insulator material, such as any suitable oxide (e.g., silicon dioxide), nitride (e.g., silicon nitride), and/or dielectric material(s). For instance, in some such embodiments, a given isolation structure may include at least one of the following: silicon (Si), oxygen (O), nitrogen (N), carbon (C), hafnium (Hf), tantalum (Ta), barium (Ba), titanium (Ti), yttrium (Y), strontium (Sr), lanthanum (La), lead (Pb), zinc (Zn), niobium (Nb), and zirconium (Zr). Further, in some such embodiments, a given isolation structure may include high-k dielectric material.

As can be understood based on this disclosure, the techniques can be implemented for transistors including group IV semiconductor material, group III-V semiconductor material, and/or any other suitable semiconductor material. The use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example. For instance, in some embodiments, the techniques can be used to benefit transistors including channel material that includes Si, Ge, tin (Sn), indium (In), gallium (Ga), arsenic (As), and/or aluminum (Al).

In some embodiments, the techniques described herein can be used to benefit n-channel devices (e.g., n-MOS) and/or p-channel devices (e.g., p-MOS). Further, in some embodiments, the techniques described herein can be used to benefit MOSFET devices, tunnel FET (TFET) devices, Fermi filter FET (FFFET) devices, and/or any other suitable devices as will be apparent in light of this disclosure. Further still, in some embodiments, the techniques described herein can be used to form complementary transistor circuits (such as CMOS circuits), where the techniques can be used to benefit one or more of the included n-channel and p-channel transistors making up the CMOS circuit. Further yet, in some embodiments, the techniques described herein can be used to benefit a multitude of transistor configurations, such as planar and non-planar configurations, where the non-planar configurations may include finned or FinFET configurations (e.g., dual-gate or tri-gate), gate-all-around (GAA) configurations (e.g., nanowire or nanoribbon), or some combination thereof (e.g., a beaded-fin configurations), to provide a few examples. The techniques may be used to benefit only one of a given S/D region pair (i.e., either the source region or the drain region) for a given transistor, such that only one of S/D regions includes non-selectively deposited S/D material in the final structure, in accordance with some embodiments. However, in other embodiments, both of the S/D regions (i.e., both the source region and the drain region) for a given transistor may be processed using the techniques described herein. Therefore, the techniques for forming transistors employing non-selectively deposited S/D material can benefit a multitude of transistor devices, as will be apparent in light of this disclosure.

Note that, as used herein, the expression "X includes at least one of A and B" refers to an X that may include, for example, just A only, just B only, or both A and B. To this end, an X that includes at least one of A and B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, and C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, and C is not to be understood as an X that requires each of A, B, and C, unless expressly so stated. For instance, the expression "X includes A, B, and C" refers to an X that expressly includes each of A, B, and C.

Use of the techniques and structures provided herein may be detectable using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit (IC) including at least one transistor including non-selectively deposited S/D material. In some such embodiments, the techniques may be detected via electron microscopy (e.g., SEM/TEM) and/or atom probe tomography to observe compositional profiles in a given transistor S/D region, to identify dopant concentration differences across the S/D profile (e.g., when going in a vertical direction, as the interface between selectively deposited S/D material and non-selectively deposited S/D material is crossed). In some embodiments, the presence of dopant atoms on gate spacer sidewalls and/or the presence of deposition/etchant species (e.g., chlorine, fluorine, bromide, carbon, silicon, germanium, phosphorous, boron, arsenic, etc.) on gate spacer sidewalls may indicated use of the techniques described herein.

In some embodiments, electron microscopy (e.g., TEM/SEM) may be used to identify the presence of the isolation structures as described herein, which are employed to enable the use of non-selectively deposited S/D material. In some such embodiments, the interface of the compositional change within a given S/D region (e.g., the compositional change from the selectively deposited S/D material to the non-selectively deposited S/D material) occurs below the top surface of an adjacent dielectric isolation structure and above the bottom of the corresponding channel region, for example. Further, in some embodiments, a given isolation structures as described herein may be located at least in part between two adjacent transistors, such that the given isolation structure is between the source regions of the two adjacent transistors (or between the source region of one transistor and the drain region of the other transistor, where the transistors are inverted relative to each other, such that the source region of one transistor is adjacent the drain region of the other transistor). In some such embodiments, the given isolation structure may also be located between the channel regions of the two adjacent transistors and also between the drain regions of the two adjacent transistors. In some embodiments, the techniques and structures described herein may be detected based on the benefits derived therefrom, such as the relatively increased performance derived from employing non-selectively deposited S/D material (as compared to only employing selectively deposited S/D material). Further, in some embodiments, the techniques described herein may enable forming transistor devices with sub-50 nm gate lengths (or gate lengths below some other suitable threshold as will be apparent in light of this disclosure), which can also be detected and measured. In some embodiments, the techniques enable transistor scaling (particularly for non-planar transistors, such as FinFETs) to future nodes (with relatively smaller gate lengths and novel material schemes) to ensure low operating voltage, higher drive currents, faster switching speeds, and thereby an overall improved performance. Numerous configurations and variations will be apparent in light of this disclosure.

Architecture and Methodology

Figure 1B:
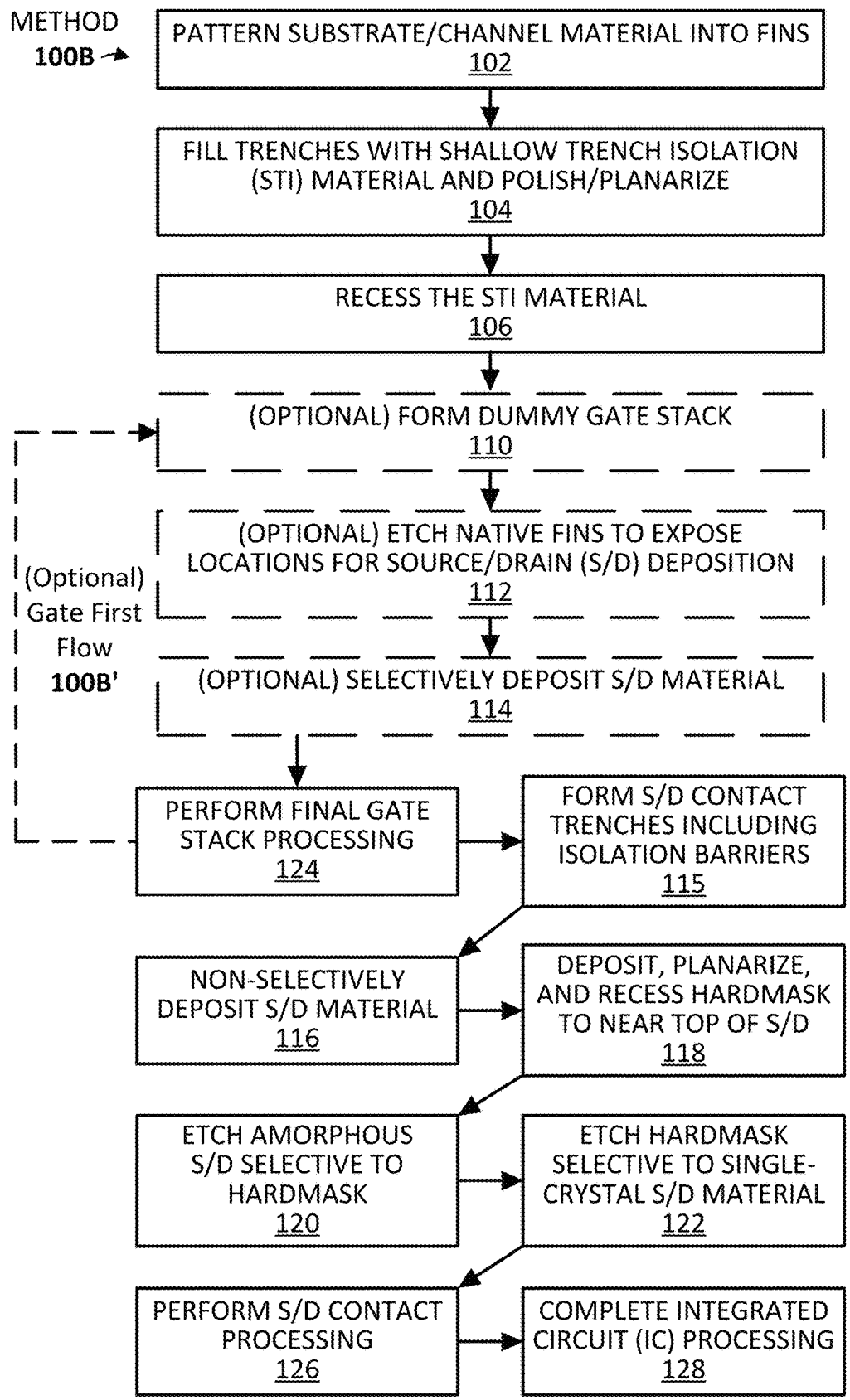

FIGS. 1A-B illustrate methods 100A-B of forming an integrated circuit (IC) including at least one transistor employing non-selectively deposited source/drain (S/D) material, in accordance with some embodiments of the present disclosure. FIGS. 2A-2O and 4A-4L illustrate example structures that are formed when carrying out methods 100A-B of FIGS. 1A-B, respectively, in accordance with some embodiments. As will be apparent in light of this disclosure, method 100A of FIG. 1A (and the example structures formed therefrom, illustrated in FIGS. 2A-2O) includes up-front processing of isolation structures and non-selectively deposited S/D material, such as prior to forming a final gate stack (e.g., in embodiments including a gate last process flow). As will also be apparent in light of this disclosure, method 100B of FIG. 1B (and the example structures formed therefrom, illustrated in FIGS. 4A-4L) includes forming isolation structures and non-selectively deposited S/D material during S/D contact loop processing, such as after forming a final gate stack (e.g., in embodiments including a gate last process flow). Note that methods 100A-B each include a primary path that illustrates a gate last transistor fabrication process flow (e.g., a replacement gate or replacement metal gate (RMG) process flow), in accordance with some embodiments. However, in other embodiments, a gate first process flow may be used, as will be described herein (and which is illustrated with the alternative gate first flow 100A' indicator in FIG. 1A and the alternative gate first flow 100B' indicator in FIG. 1B). Numerous variations and configurations related to methods 100A-B will be apparent in light of this disclosure.

The structures of FIGS. 2A-2O and 4A-4L are primarily depicted and described herein in the context of forming finned or FinFET transistor configurations (e.g., tri-gate transistor configurations), for ease of illustration. However, in some embodiments, the techniques can be used to form transistors of any suitable geometry or configuration, as can be understood based on this disclosure. For example, FIGS. 2N and 4E illustrate example IC structures including transistors with nanowire configurations, as will be described in more detail below. Other transistor configurations will be apparent in light of this disclosure, such as planar configurations, dual-gate configurations (e.g., a finned configuration including a hardmask on top of the fin, such that the gate stack or structure controls only two sides of the fin and not the top), and beaded-fin configurations (e.g., a combination of a finned and nanowire configuration, where the nanowires are not fully separated and include connecting semiconductor material between them), to provide some additional examples.

A multitude of different transistors can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs), to name a few examples. For example, the techniques may be used to benefit either or both of the S/D regions of an n-channel MOSFET (n-MOS) device, which may include a source-channel-drain doping scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques may be used to benefit either or both of the S/D regions of a p-channel MOSFET (p-MOS) device, which may include a source-channel-drain doping scheme of p-n-p or p-i-p, in accordance with some embodiments. In yet another example, the techniques may be used to benefit either or both of the S/D regions of a TFET device, which may include a source-channel-drain doping scheme of p-i-n or n-i-p, in accordance with some embodiments. In still another example, the techniques may be used to benefit either or both of the S/D regions of a FFFET device, which may include a source-channel-drain doping scheme of np-i-p (or np-n-p) or pn-i-n (or pn-p-n), in accordance with some embodiments. Further, the techniques may be used to benefit complementary transistor circuits, such as CMOS circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Method 100A of FIG. 1 includes patterning 102 substrate 200 into fins 202 to form the example resulting structure shown in FIG. 2B, in accordance with some embodiments. As can be understood based on this disclosure, in some embodiments, at least a portion of substrate 200 may be used for the channel region material for one or more transistors formed therefrom. However, the present disclosure is not intended to be so limited. For example, layer 200 may be a channel region material layer from which the channel region of one or more transistors are formed, but it need not be the bottom-most layer of an IC structure (which is commonly referred to as a substrate), in accordance with some embodiments. For instance, layer 200 may include one or more underlying layers (e.g., a bulk wafer layer), in some embodiments. In addition, in some embodiments, substrate 200 may be used to form templates from which the channel region material is to be formed (e.g., via replacement material). An example of such an embodiment will be described with reference to FIG. 2C' herein. However, for ease of illustration, the following description will primarily treat layer 200 as both the substrate and the channel region material layer, as will be apparent in light of this disclosure.

As shown in the example structure of FIG. 2A, to form the structure of FIG. 2B, hardmask 210 was patterned on substrate 200 to assist with forming substrate 200 into fins 202, in this example embodiment. Hardmask 210 may be formed or deposited on substrate 200 using any suitable techniques, as will be apparent in light of this disclosure. For example, hardmask 210 may be blanket deposited or otherwise grown on substrate 200 using chemical vapor deposition (CVD), atomic layer deposition (ALD), physical vapor deposition (PVD), spin-on processing, and/or any other suitable process to form hardmask 210 on substrate 200. In some instances, the top surface of substrate 200 on which hardmask 210 is to be deposited may be treated (e.g., chemical treatment, thermal treatment, etc.) prior to deposition of the hardmask 210 material. Hardmask 210 can be patterned 102 using any suitable techniques, such as one or more lithography and etch processes, for example. Hardmask 210 may include any suitable material, such as oxide material, nitride material, and/or any other suitable dielectric material, for example. Specific oxide and nitride materials may include silicon oxide, titanium oxide, hafnium oxide, aluminum oxide, silicon nitride, and titanium nitride, just to name a few examples. In some embodiments, hardmask 210 may include at least one of silicon (Si), oxygen (O), nitrogen (N), and carbon (C). In some cases, the material of hardmask 210 may be selected based on the material of substrate 200, for example.

Substrate 200, in some embodiments, may include: a bulk substrate including group IV semiconductor material, such as silicon (Si), germanium (Ge), silicon germanium (SiGe), or silicon carbide (SiC), and/or group III-V material and/or any other suitable semiconductor material(s) as will be apparent in light of this disclosure; an X on insulator (XOI) structure where X is one of the aforementioned semiconductor materials (e.g., group IV and/or group III-V semiconductor material) and the insulator material is an oxide material or dielectric material or some other electrically insulating material; or some other suitable multilayer structure where the top layer includes one of the aforementioned semiconductor materials (e.g., group IV and/or group III-V semiconductor material). The use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example. In some embodiments, substrate 200 may be doped with any suitable n-type and/or p-type dopant. For instance, in the case, of a Si substrate, the Si may be p-type doped using a suitable acceptor (e.g., boron) or n-type doped using a suitable donor (e.g., phosphorous, arsenic), to provide some example cases. However, in some embodiments, substrate 200 may be undoped/intrinsic or relatively minimally doped (such as including a dopant concentration of less than 1E16 atoms per cubic cm), for example.

In some embodiments, substrate 200 may include a surface crystalline orientation described by a Miller Index of (100), (110), or (111), or its equivalents, as will be apparent in light of this disclosure. In some embodiments, substrate 200 includes monocrystalline or single-crystal semiconductor material, which can be used as seeding material for the epitaxial growth of other monocrystalline or single-crystal semiconductor material thereon, leading to high quality monocrystalline semiconductor material for IC devices formed on/above substrate 200. Although substrate 200, in this example embodiment, is shown as having a thickness (dimension in the vertical or Y-axis direction) similar to other layers shown in subsequent structures for ease of illustration, in some instances, substrate 200 may be much thicker than the other layers, such as having a thickness in the range of 50 to 950 microns, for example, or any other suitable thickness as will be apparent in light of this disclosure. In some embodiments, substrate 200 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Continuing with process 102 to form at least a portion of substrate 200 into fins, any suitable techniques may be used to form the example resulting structure of FIG. 2B, such as performing a shallow trench recess (STR) etch, in accordance with an embodiment. The STR etch used to form trenches 215 and fins 202 may include any suitable wet and/or dry etching processes, for example. In some such cases, the STR etch may be performed in-situ/without air break, while in other cases, the STR etch may be performed ex-situ, for example, which is generally the case for any etches described herein. Trenches 215 may be formed with varying widths (dimension in the horizontal or X-axis direction) and depths (dimension in the vertical or Y-axis direction) as can be understood based on this disclosure. For example, multiple hardmask patterning and STR etch processes may be performed to achieve varying depths in the trenches 215 between fins 202. Fins 202 may be formed to have varying widths Fw (dimension in the horizontal or X-axis direction) and heights Fh (dimension in the vertical or Y-axis direction).

In some embodiments, the fin widths Fw (dimension in the horizontal or X-axis direction) may be in the range of 2-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. In some embodiments, the fin heights Fh (dimension in the vertical or Y-axis direction) may be in the range of 4-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the fin heights Fh may be at least 25, 50, 75, 100, 125, 150, 175, 200, 300, 400, or 500, 600, 700, or 800 nm tall, or greater than any other suitable threshold height as will be apparent in light of this disclosure. In some embodiments, the height to width ratio of the fins (Fh:Fw) may be greater than 1, such as greater than 1.5, 2, 2.5, 3, 3.5, 4, 4.5, 5, 6, 7, 8, 9, or 10, or greater than any other suitable threshold ratio, as will be apparent in light of this disclosure. Note that the trenches 215 and fins 202 are each shown as having essentially the same sizes and shapes in this example structure for ease of illustration; however, the present disclosure is not intended to be so limited. For example, in some embodiments, the fins 202 may be formed to have varying heights Fh, varying widths Fw, varying starting points (or varying starting heights), varying shapes, and/or any other suitable variations as will be apparent in light of this disclosure. Moreover, trenches 215 may be formed to have varying depths, varying widths, varying starting points (or varying starting depths), varying shapes, and/or any other suitable variations as will be apparent in light of this disclosure. Further note that although four fins 202 are shown in the example structure of FIG. 2B for ease of illustration, any number of fins may be formed, such as one, two, three, five, ten, hundreds, thousands, millions, billions, and so forth, as can be understood based on this disclosure.

Method 100A of FIG. 1A continues with filling 104 trenches 215 with shallow trench isolation (STI) material 220 and polishing/planarizing to form the resulting example structure shown in FIG. 2C, in accordance with some embodiments. In some embodiments, filling process 104 may include any suitable deposition/growth process described herein (e.g., CVD, ALD, PVD), or any other suitable formation processing. In some embodiments, STI material 220 may include any suitable insulating material, such as one or more dielectric, oxide (e.g., silicon dioxide), and/or nitride (e.g., silicon nitride) materials. In some embodiments, STI material 220 may be selected based on the material of substrate 200. For instance, in the case of a Si substrate, STI material may be silicon dioxide or silicon nitride, to provide some examples. In some embodiments, the planarizing and/or polishing processing performed after forming STI material 220 may include any suitable techniques, such as chemical-mechanical planarization/polishing (CMP) processes, for example.

In embodiments where the fins are to be removed and replaced with replacement semiconductor material (e.g., to be used in the channel region of one or more transistor devices), the structure of FIG. 2C enables such processing. For example, continuing from the structure of FIG. 2C, fins 202 may be recessed or removed using selective etch processing (e.g., for a given etchant, the semiconductor material of fins 202 is removed selective to the insulator material of STI layer 220) to form fin-shaped trenches between STI material 220 in which replacement semiconductor material can be deposited/grown (e.g., using any suitable techniques, such as CVD, metal-organic CVD (MOCVD), ALD, molecular beam epitaxy (MBE), PVD). For instance, FIG. 2C' is a blown-out portion of FIG. 2C illustrating the alternative recess and replace processing to form replacement material fins, in accordance with some embodiments. In FIG. 2C', replacement fin 202' was formed, and the replacement fin 202' (and generally, any replacement fin formed) may include any suitable semiconductor material (e.g., group IV and/or III-V semiconductor material). For instance, replacement fins including SiGe or Ge may be formed by removing native Si fins during such processing and replacing them with the SiGe or Ge material, to provide some examples. In addition, replacement fin 202' may include any suitable n-type or p-type dopant. In some embodiments, replacement material fins, such as fin 202' of FIG. 2C' may be formed using alternative processing. For instance, in some embodiments, replacement material fins may be formed by blanket-growing the replacement material on the substrate (e.g., using epitaxial deposition processing) and then patterning the replacement material into replacement material fins, to provide an example alternative. Such an example alternative process may also include forming STI material between the replacement material fins to form a structure similar to that shown in FIG. 2C', for instance. Note that replacement fin 202' is illustrated with patterning/shading to merely assist with visually identifying that feature; however, the patterning/shading is not intended to limit the present disclosure in any manner.

Note that only one fin is shown being replaced in the example embodiment of FIG. 2C'; however, the present disclosure is not intended to be so limited. In some embodiments, all of the native fins 202 may be replaced or only a subset may be replaced (e.g., such that some replacement fins are available for subsequent processing and some native fins 202 remain for subsequent processing). Further, in some embodiments, the recess and replace process may be performed as many times as desired to form as many subsets of replacement fins as desired by masking off the areas not to be processes for each replacement fin subset processing. In some such embodiments, a first subset of replacement fins may be formed for n-channel transistors (e.g., where the first replacement material is selected to increase electron mobility) and a second subset of replacement fins may be formed for p-channel transistors (e.g., where the second replacement material is selected to increase hole mobility). Further still, in some embodiments, a multilayer replacement fin may be formed to enable the subsequent formation of nanowires or nanoribbons in the channel region of one or more transistors, where some of the layers in the multilayer replacement fin are sacrificial and intended to be removed via selective etching (e.g., during replacement gate processing), which will be described in more detail herein. Further note that the recess process used to form replacement fin 202' included recessing native fin 202 (i.e., native to substrate 200) to a depth as shown, such that a portion of that native fin 202 remains, which is referred to as sub-fin portion 203 (indicated in FIG. 2C'). However, in other embodiments, the recess process may completely remove a given native fin 202 or recess the given native fin 202 to a different depth (e.g., a different point in the vertical or Y-axis direction).

In embodiments employing an aspect ratio trapping (ART) integration scheme, fins 202 may be formed to have particular height to width ratios such that if they are later removed or recessed (e.g., to form replacement fins 202' in FIG. 2C'), the resulting fin-shaped trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects, if such an ART scheme is used. As can be understood in some such embodiments, the channel region material need not be native to substrate 200 (as opposed to the structures formed using method 100, as will be apparent in light of this disclosure). In some such embodiments employing an ART scheme, the fins may be formed to have particular height to width ratios such that when they are later recessed and/or removed, the resulting fin trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects.

Generally, in a trench fill integration scheme, the fins may be formed to have particular height to width ratios such that when they are later removed or recessed, the resulting trenches formed allow the replacement material deposited to grow vertically from the native substrate bottom and be confined by non-crystalline/dielectric sidewalls. The material used to fill these trenches may be sufficiently lattice matched to the substrate (or to a buffer layer used between the substrate and replacement material) such that effectively no relaxation or threading misfit dislocation formation occurs (e.g., the misfit dislocations occur at levels below 1E5 dislocations per square cm). For instance, this lattice match condition is true for native Si fins and trench fill of SiGe replacement material having Ge concentration (by atomic percentage) of less than 45% and fin heights Fh of less than 50 nm, to provide an example. Alternatively, using the Si substrate example (where the native Si fins are recessed to form trenches), a replacement material trench fill of Ge, SiGe with Ge concentration of at least 80%, or GaAs can be performed such that the dislocations form right at the native/replacement material interface and again effectively no threading misfit dislocation formation occurs at the top surface of the replacement material fin (e.g., the misfit dislocations occur at levels below 1E5 dislocations per square cm). For ease of illustration, method 100A of FIG. 1A will continue being described using structures that include native fins 202.

Method 100A of FIG. 1A continues with recessing 106 the STI material 220 to cause at least a portion 204 of fins 202 to exude from the STI plane, thereby forming the resulting example structure shown in FIG. 2D, in accordance with some embodiments. As can be understood based on this disclosure, fin portions 204 may be used in the active channel region of one or more transistors, such that fin portions 204 (the portions of fins 202 above the top plane of STI layer 220) may be referred to as active fin portions herein, for example. Moreover, the remaining portions of fins 202 below the top plane of STI layer 220 are indicated as portions 203, where such portions may be referred to as sub-fin or sub-channel portions, for example. As shown in FIG. 2D, the portions 204 of fins 202 exuding above the top plane of STI layer 220 have an active fin height indicated as Fah, which may be in the range of 4-800 nm (e.g., in the subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range, as will be apparent in light of this disclosure. In some embodiments, the active fin heights Fh may be at least 25, 50, 75, 100, 125, 150, 175, 200, 300, 400, 500, 600, 700, or 800 nm tall, or greater than any other suitable threshold height as will be apparent in light of this disclosure.

Figure 2E:
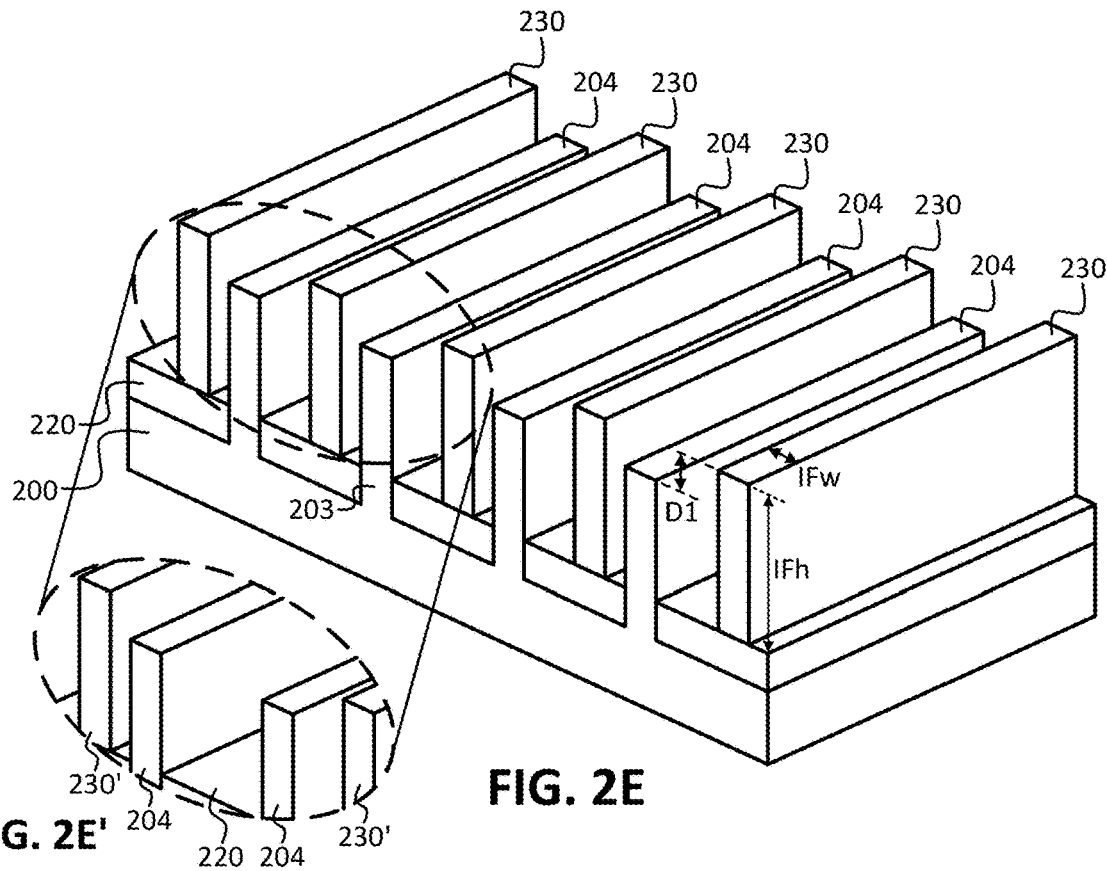
FIG. 2E' is a blown-out portion of FIG. 2E illustrating a variation where two semiconductor fins are between a given pair of isolation structures without any additional intervening isolation structures therebetween, in accordance with some embodiments.

Method 100A of FIG. 1A continues with forming 108 isolation structures 230, which includes depositing, patterning, and recessing the isolation structures to form the example resulting structure of FIG. 2E, in accordance with some embodiments. In some embodiments, the material of isolation structures 230 may be first deposited on the structure of FIG. 2D, followed by patterning the portions of the isolation structure material to be kept (e.g., similar to how hardmask 210 was used to pattern substrate 200 into fins 202), and then recessing the unpatterned portions (e.g., via an etch process that selectively removes the isolation structure material without removing the material of substrate 200) to form isolation structures 230. As will be apparent in light of this disclosure, the isolation structures may be formed to assist with subsequent processing, such as to assist with enabling the use of non-selective deposition of S/D material, for example. In some embodiments, a given isolation structure 230 may include any suitable material, such as any suitable dielectric, oxide (e.g., silicon dioxide), nitride (e.g., silicon nitride), and/or any other electrical insulator material(s). For instance, in some such embodiments, a given isolation structure 230 may include at least one of the following: silicon (Si), oxygen (O), nitrogen (N), carbon (C), hafnium (Hf), tantalum (Ta), barium (Ba), titanium (Ti), yttrium (Y), strontium (Sr), lanthanum (La), lead (Pb), zinc (Zn), niobium (Nb), and zirconium (Zr). Further, in some such embodiments, a given isolation structure may include high-k dielectric material. In some embodiments, a given isolation structure 230 may include a multilayer structure including at least two different insulator materials. Note that isolation structures 230 are formed on STI material 220 in this example embodiment, such that STI material 220 is below each isolation structure 230. In some embodiments, isolation structures 230 may include the same material as STI material 220 or isolation structures 230 may include different material.

Note that in the example embodiment of FIG. 2E, the isolation structures 230 are fin-shaped. However, the present disclosure need not be so limited, as the isolation structures may include any other suitable shape as will be apparent in light of this disclosure. In some embodiments, the isolation structure fin widths IFw (dimension in the horizontal or X-axis direction) may be in the range of 2-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. In some embodiments, the isolation structure fin heights IFh (dimension in the vertical or Y-axis direction) may be in the range of 4-1000 nm (or in a subrange of 4-10, 4-20, 4-50, 4-100, 4-200, 4-400, 10-20, 10-50, 10-100, 10-200, 10-400, 10-800, 10-1000, 50-100, 50-200, 50-400, 50-800, 50-1000, 100-400, 100-800, 100-1000, 400-800, or 500-1000 nm), for example, or any other suitable value or range as will be apparent in light of this disclosure. In some embodiments, the isolation fin heights Fh may be at least 25, 50, 75, 100, 125, 150, 175, 200, 300, 400, 500, 600, 700, 800, 900, or 1000 nm tall, or greater than any other suitable threshold height as will be apparent in light of this disclosure. In some embodiments, the height to width ratio of the isolation structure fins (IFh:IFw) may be greater than 1, such as greater than 1.5, 2, 2.5, 3, 3.5, 4, 4.5, 5, 6, 7, 8, 9, or 10, or greater than any other suitable threshold ratio, as will be apparent in light of this disclosure.

In some embodiments, the difference in height D1 between the top surface of a given fin 204 and the top surface of its adjacent isolation structure 230 may be in the range of 10-200 nm (or in a subrange of 10-50, 10-100, 10-150, 50-100, 50-150, 50-200, 100-150, 100-150, 100-200, or 150-200 nm). In some embodiments, the difference in height D1 (difference in the vertical or Y-axis direction) between the top surfaces of the two features 204 and 230 may be at least 10, 20, 30, 40, 50, 60, 70, 80, 90, 100, 110, 120, 130, 140, 150, 160, 170, 180, 190, or 200 nm, or at least some other suitable threshold value as will be apparent in light of this disclosure. Note that it may be desired to form isolation structures 230 on opposite sides of a given fin 204 such that the isolation structures 230 are relatively taller (have a higher top surface) to allow for the non-selective deposition of S/D material followed by selectively removing that non-selectively deposited S/D material from the top surface of the isolation structures 230, as will be described in more detail herein. Also note that an isolation structure 230 is formed between each fin 204 in this example embodiment, however, the present disclosure is not intended to be so limited. For example, multiple fins 204 (e.g., 2-10 or more) may be included between a given set of isolation structures 230 without any other intervening isolation structures 230 being present. For instance, FIG. 2E' is a blown-out portion of FIG. 2E illustrating a variation where two semiconductor fins 204 are between a given pair of isolation structures 230' without any additional intervening isolation structures 230' therebetween, in accordance with some embodiments. Such embodiments where multiple fins 204 (or the regions where they were originally formed) are included between a given pair of isolation structures without any additional intervening isolation structures is described in more detail herein with reference to method 100B and FIGS. 4A-L.

Figure 2F:
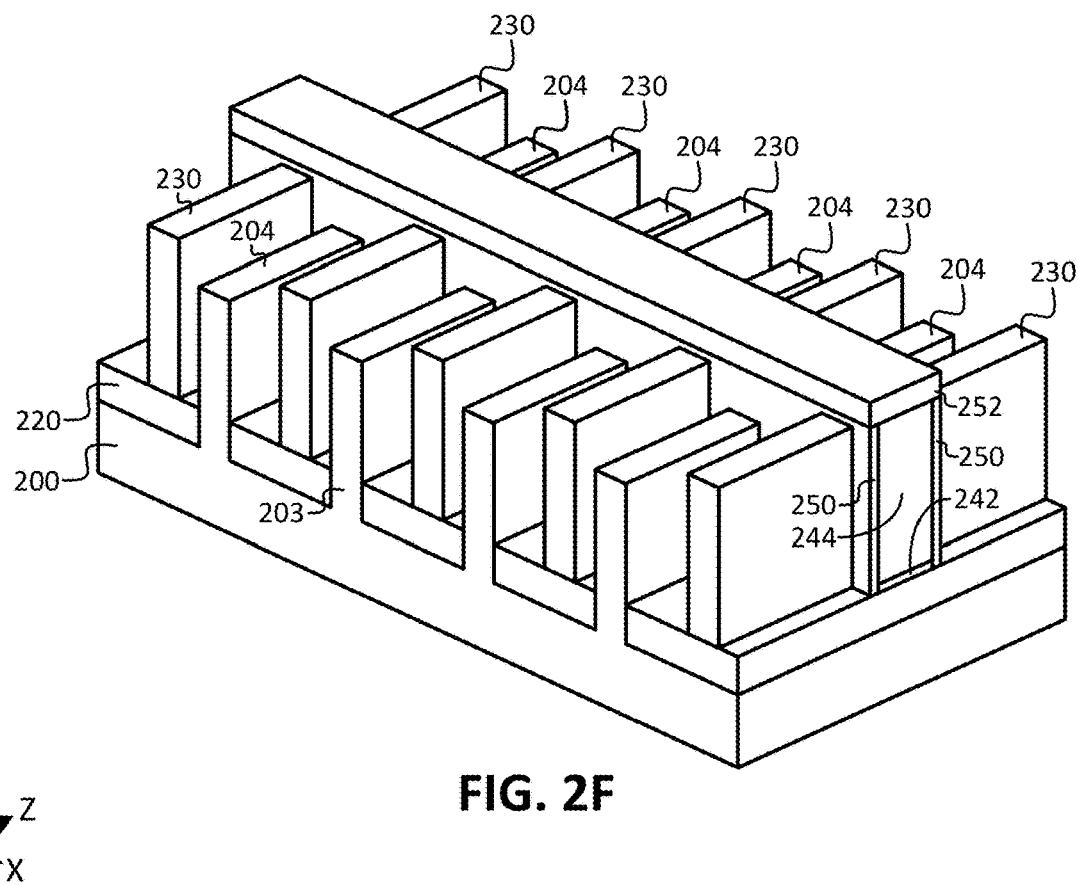
FIGS. 2A-2O illustrate example structures that are formed when carrying out the method of FIG. 1A, in accordance with some embodiments.
FIG. 2C' is a blown-out portion of FIG. 2C illustrating alternative recess and replace processing that can be used to form replacement material fins, in accordance with some embodiments.
FIG. 2H' is a blown-out portion of FIG. 2H that illustrates forming final S/D material on a semiconductor fin from the structure of FIG. 2F in a cladding scheme, in accordance with some embodiments.
FIG. 2I' is a blown-out portion of FIG. 2I that illustrates forming only non-selectively deposited S/D material in the S/D regions, in accordance with some embodiments.
FIG. 2M' illustrates a blown-out portion of FIG. 2M to illustrate various features of the example structure, in accordance with some embodiments.

Method 100A of FIG. 1A continues with optionally forming 110 a dummy gate stack to form the example resulting structure of FIG. 2F, in accordance with some embodiments. Recall that method 100A is primarily described herein in the context of a gate last transistor fabrication process flow, where the processing includes forming a dummy gate stack, performing the S/D processing, and then forming the final gate stack after the S/D regions have been processed (followed by S/D contact loop and back-end-of-line processing). However, in other embodiments, the techniques may be performed using a gate first process flow. In such an example case, process 110 (forming a dummy gate stack), would not be performed as the final gate stack would be formed at the location of box 110, and thus, process 110 may be optional in some embodiments (such as those employing the gate first process flow). This is reflected with the alternative location for performing 124 final gate stack processing, which is shown as the optional gate first flow 100A' in FIG. 1A, where performing 124 the final gate stack processing would alternatively occur at the location of box 110 in such an optional gate first transistor fabrication process flow, for example. However, the description of method 100A will continue using a gate last process flow, to allow for such a flow (which typically includes additional processing) to be adequately described.

Continuing with forming 110 a dummy gate stack, such a dummy gate stack (where employed) may include dummy gate dielectric 242 and dummy gate electrode 244, thereby forming the example resulting structure of FIG. 2F, in accordance with some embodiments. In this example embodiment, dummy gate dielectric 242 (e.g., dummy oxide material) and dummy gate or dummy gate electrode 244 (e.g., dummy poly-silicon material) may be used for a replacement gate process. Note that side-wall spacers 250, referred to generally as gate spacers (or simply, spacers), on either side of the dummy gate stack were also formed, and such spacers 250 can help determine the channel length and can help with replacement gate processes, for example. As can be understood based on this disclosure, the dummy gate stack (and spacers 250) can help define the channel region and the source and drain (S/D) regions of each fin 204, where the channel region is below the dummy gate stack (as it will be located below the final gate stack), and the S/D regions are on either side of and adjacent to the channel region. Note that because the IC structures are being described in the context of forming finned transistors, the final gate stack will also be adjacent to either side of the fin (in the X-axis direction), as the gate stack will reside along three walls of the finned channel regions, in embodiments employing a finned (e.g., FinFET) configuration.

Formation of the dummy gate stack may include depositing the dummy gate dielectric material 242 and dummy gate electrode material 244, patterning the dummy gate stack, depositing gate spacer material 250, and performing a spacer etch to form the structure shown in FIG. 2F, for example. Spacers 250 may include any suitable material, such as any suitable dielectric, oxide (e.g., silicon dioxide), nitride (e.g., silicon nitride), and/or electrical insulator material(s), as will be apparent in light of this disclosure. Note that in some embodiments, as previously described, the techniques described herein need not include forming a dummy gate stack, such that a final gate stack may be formed in the first instance (e.g., where dummy gate electrode 244 and dummy gate dielectric 242 would instead be the final gate 284 and final gate dielectric 284, respectively, in the structure of FIG. 2F). Regardless, with either a gate last or a gate first process flow, the end structure will include the final gate stack which is described in more detail below, as will be apparent in light of this disclosure. Also note that in this example embodiment, hardmask 252 was formed over the dummy gate stack and also over spacers 250 to allow for subsequent processing and/or to protect the dummy gate stack during subsequent processing, for example. In some embodiments, hardmask 252 may also or alternatively be formed between spacers 250 as opposed to being formed completely above spacers 250 as shown in FIG. 2F.

Figure 2G:
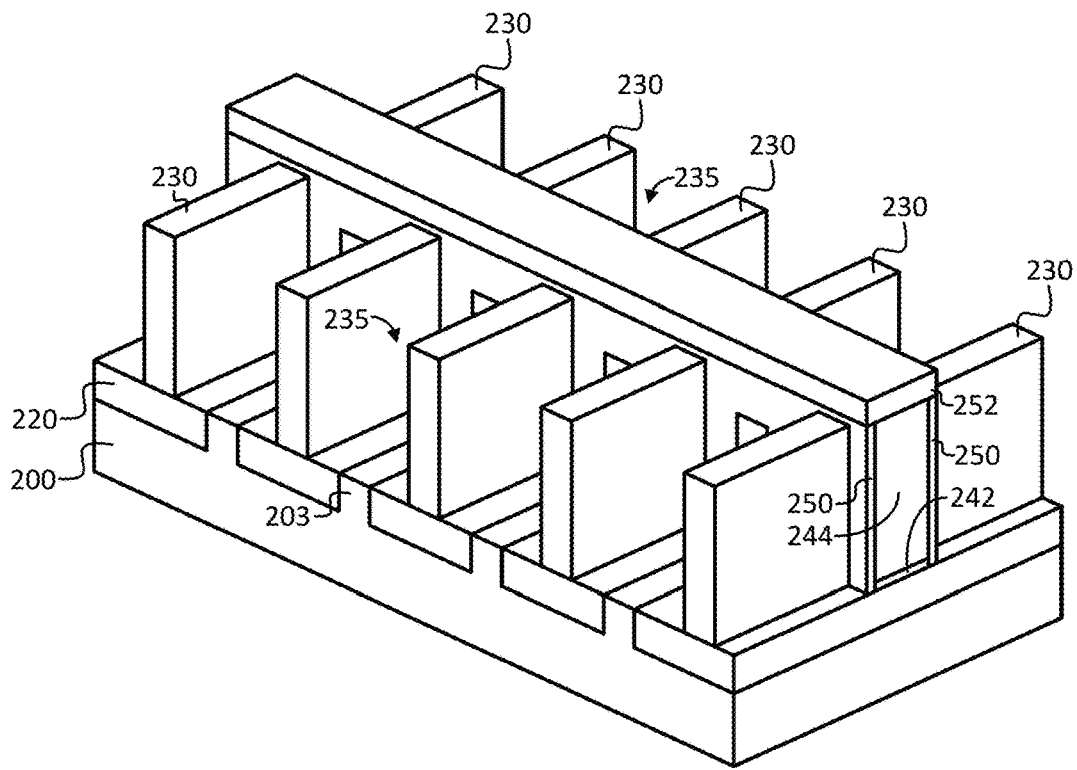

Method 100A of FIG. 1A continues with optionally etching 112 the native fins 204 in the source and drain (S/D) regions to expose locations for the S/D material deposition, thereby forming the resulting example structure of FIG. 2G, in accordance with some embodiments. This etching process 112 is optional, because the native fins 204 (or replacement fins, if such replacement fins were formed, such as fin 202') need not be removed, as the subsequent S/D processing may occur over such fins, in some embodiments (e.g., as will be discussed with respect to FIG. 2H'). However, in the example embodiment of FIG. 2G, the semiconductor material fins 204 were etched to remove them as shown, which can be performed via a selective etch process that removes the exposed semiconductor material relative to the exposed insulator material of hardmask 252, isolation structures 230, and STI material 220 (e.g., at a relatively faster rate or only removes the exposed semiconductor material and not the exposed insulator material). The removal of fins 204 from the S/D regions results in trenches 235 formed between the isolation structures 230 as shown in FIG. 2G. Note that the removal of fins 204 stopped at the top plane of the STI material 220 and the outer surface plane of spacers 250, in this example embodiment; however, the present disclosure is not intended to be so limited (unless otherwise stated).

Figure 2H:
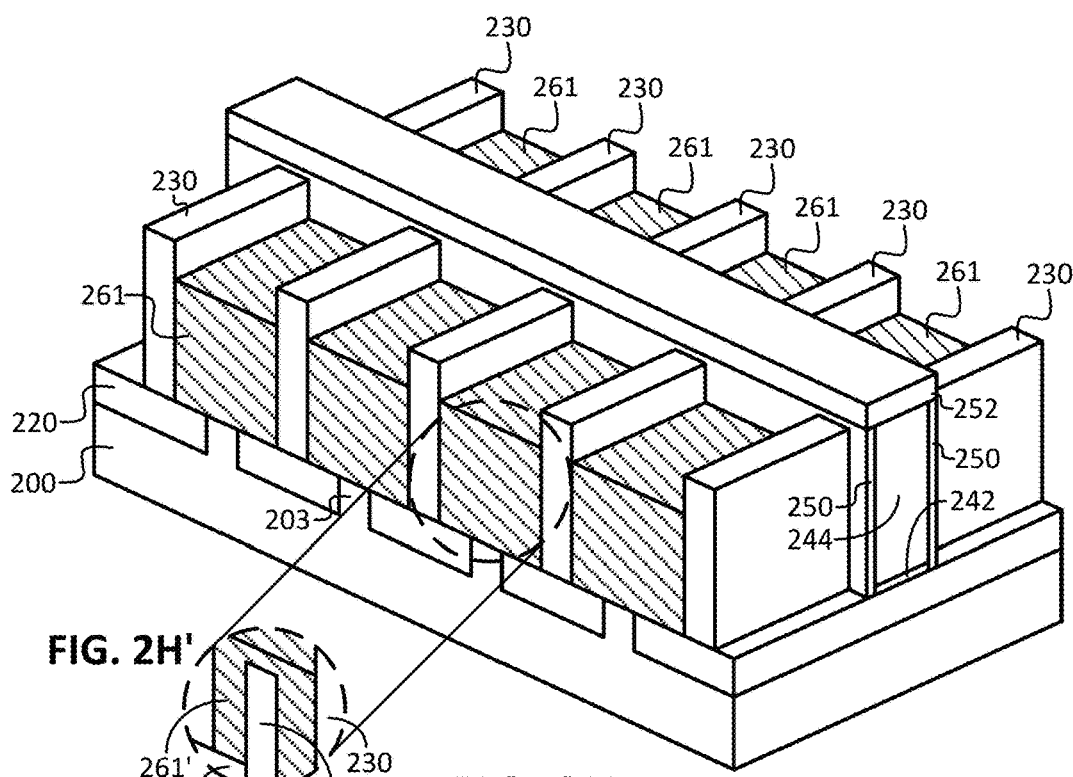

Method 100A of FIG. 1A continues with optionally selectively depositing 114 S/D material 261 in the trenches 235 of the structure of FIG. 2G to form the resulting example structure of FIG. 2H, in accordance with some embodiments. This selective deposition process 114 is optional, because the entirety of the S/D material may be deposited using non-selective deposition techniques, in some embodiments, such that the selective deposition of S/D material need not be performed. However, in the example embodiment of FIG. 2H, selectively deposited S/D material 261 was formed in trenches 235. In some embodiments, selective deposition 114 may include any suitable techniques, such as CVD, MOCVD, ALD, MBE, PVD, and/or any other suitable process as can be understood based on this disclosure. As is known in the art, deposition techniques for semiconductor materials can be performed in a selective or non-selective manner based on the characteristics and conditions of the deposition, where the selective deposition, in this example embodiment, includes forming semiconductor material only significantly from/on other semiconductor material and non-selective deposition includes forming the semiconductor material on all exposed material surfaces. Therefore, as shown in FIG. 2H, the selectively deposited S/D material 261 was formed from/on the top seeding surface of sub-fin portion 203 of the semiconductor fins. As can be understood based on the structure of FIG. 2H, the selectively deposited S/D material 261 filled up the entire width (dimension in the X-axis direction) of trenches 235 when it was being formed, in this example embodiment; however, the present disclosure need not be so limited (unless otherwise stated).

Recall that in some embodiments, the S/D material (whether or not that S/D material is selectively deposited) may be formed over native fins 204 (and/or replacement fins) if optional process 112 is not performed. For instance, FIG. 2H' is a blown-out portion of FIG. 2H that illustrates forming S/D material 261' on the fins of FIG. 2F, in accordance with some embodiments. Thus, in such an example embodiment, the optional processing 112 to form the structure of FIG. 2G is not performed, such that the native fins 204 (and/or replacement fins, if replacement fins are formed such as replacement fin 202' in FIG. 2C') remain in the S/D regions. The selectively deposited S/D material will be described in more detail herein and all relevant description of S/D material 261 and 262 is equally applicable to S/D material 261'.

Method 100A of FIG. 1A continues with non-selectively depositing 116 S/D material 262 on the structure of FIG. 2H to form the resulting example structure of FIG. 2I, in accordance with some embodiments. In some embodiments, non-selective deposition 116 may include any suitable techniques, such as CVD, MOCVD, ALD, MBE, PVD, and/or any other suitable process as can be understood based on this disclosure. Recall that non-selective deposition of S/D material 262 results in the material being significantly formed on all exposed surfaces, with such formation being in a conformal manner (e.g., it tracks the topography of the exposed surfaces) in the example embodiment of FIG. 2I. Numerous benefits can be derived from being able to non-selectively deposit 116 S/D material 262 and retain that material in the S/D regions while removing it from other areas, as will be apparent in light of this disclosure. Note that selectively deposited S/D material 261 and non-selectively deposited S/D material 262 are each illustrated with patterning/shading to merely assist with visually identifying those features; however, the patterning/shading is not intended to limit the present disclosure in any manner.

Recall that in some embodiments, selective deposition 114 of S/D material need not be performed, such that the entirety of a given S/D region may be filled with non-selectively deposited S/D material instead of there being a combination of selectively deposited S/D material and non-selectively deposited S/D material. For instance, FIG. 2I' is a blown-out portion of FIG. 2I that illustrates forming only non-selectively deposited S/D material 262' in the S/D regions, in accordance with some embodiments. Thus, in such an example embodiment, no selectively deposited S/D material 261 is formed and only non-selectively deposited S/D material 262' is formed in the trenches 235 of the structure of FIG. 2G. As can be understood based on this disclosure, the non-selectively deposited S/D material would form at an increased thickness over the entirety of the structure of FIG. 2G in such an example embodiment. All relevant description of non-selectively deposited S/D material 262 herein is equally applicable to S/D material 262' (e.g., equally applicable to embodiments where selectively deposited S/D material is not employed at all).

In some embodiments, S/D material 261 and 262 may include any suitable semiconductor material, such as group IV and/or group III-V semiconductor material, for example. For instance, in some embodiments, S/D material 261 and 262 may include Si, SiGe, Ge, GaAs, InGaAs, InP, and/or any other desired semiconductor material. In some embodiments, the S/D material 261 and 262 may be doped with any suitable n-type and/or p-type dopant. For instance, in the case, of the S/D regions including group IV semiconductor material, the group IV semiconductor material may be p-type doped using a suitable acceptor (e.g., boron) or n-type doped using a suitable donor (e.g., phosphorous, arsenic), to provide some example cases. Further, in the case of the S/D regions including group III-V semiconductor material, the group III-V semiconductor material may be p-type doped using a suitable acceptor (e.g., carbon) or n-type doped using a suitable donor (e.g., silicon), to provide some additional example cases. Note that when dopant is present in the semiconductor material of any feature (such as a given S/D region) of a transistor device, the dopant may be present in any desired concentration, such as in a concentration in the range of 1E16 to 5E22 atoms per cubic cm, or any other suitable concentration as will be apparent in light of this disclosure. Relatively high dopant concentrations (e.g., greater than 1E20 or 1E21 atoms per cubic cm) may be considered degenerate doping, where the semiconductor material starts to act more like a conductor (or actually does exhibit electrical properties similar to a conductor), as is known in the art. Also note that the S/D regions are referred to herein as such, but each S/D region may be either a source region or a drain region, such that the corresponding S/D region (on the other side of the corresponding channel region) is the other of the source region and drain region, thereby forming a source and drain region pair. For instance, as shown in FIG. 2H, there are four different S/D region pairs. Further note that any portion of a given S/D region may include non-selectively deposited S/D material 262, such as at least 5, 10, 15, 20, 25, 30, 40, 50, 60, 70, 80, or 90%, all the way up to 100% (such as is shown in FIG. 2I').

As previously described, S/D material 261 was selectively deposited, in the example embodiment of FIG. 2I, such that the selectively deposited S/D material 261 is only significantly located in the S/D regions of the IC structure. The benefit of using selective deposition techniques for such S/D material 261 is that the material 261 only significantly forms in the S/D regions (from seed semiconductor material surfaces). However, as was also previously described, such selective deposition techniques limit the ultimate performance of the fabricated transistors due to the selectively deposited semiconductor material 261 having limitations with respect to, for example, relatively shallower dopant profiles (e.g., cannot include as much dopant in a given semiconductor material), relatively decreased dopant activation (e.g., only a portion of the included dopant is active in the semiconductor material), and relatively lower channel strain compared to non-selectively deposited semiconductor material. Therefore, non-selectively deposited S/D material 262 is employed using the techniques described herein to benefit from the relative increases in dopant profiles (e.g., how much dopant can be chemically included in a given semiconductor material), dopant activation (e.g., the portion of the included dopant that is active in a given semiconductor material), and channel strain (e.g., advantageous strain applied to the adjacent and corresponding channel region) that can be achieved.

For instance, in some embodiments, employing non-selectively deposited S/D material 262 as variously described herein may allow for at least 1.5, 2, 2.5, 3, 3.5, 4, 4.5, 5, 6, 7, 8, 9, 10, 15, or 20 times greater included dopant concentrations in a given semiconductor material as compared to selectively depositing that semiconductor material. For example, for the deposition of a given semiconductor material, selective deposition of that semiconductor material may only be able to achieve maximum dopant concentrations of 1E20 atoms per cubic cm, but non-selective deposition of that semiconductor material may be able to achieve maximum dopant concentrations of at least 1E21 atoms per cubic cm, depending on the given semiconductor material, which is at least a 10 times greater increase in dopant concentration. Further, in some embodiments, employing non-selectively deposited S/D material 262 as variously described herein may allow for the included dopant in a given semiconductor material to be active at higher percentages, such as at percentages that are at least 1.5, 2, 2.5, 3, 3.5, 4, 4.5, 5, 6, 7, 8, 9, 10, 15, or 20 times greater as compared to selectively depositing that semiconductor material. For example, for the deposition of a given semiconductor material, selective deposition of that semiconductor material may achieve a dopant concentration of 1E20 atoms per cubic cm where only 10% of the included dopant is active, which results in an actual effective dopant concentration of 1E19 atoms per cubic cm. In such an example case, if the semiconductor material were non-selectively deposited with the same included dopant concentration of 1E20 atoms per cubic cm, the non-selectively deposited semiconductor material may be able to achieve at least 90% activation (and even up to 100%), such that at least 9E19 atoms per cubic cm were actually active (and even up to the full 1E20 atoms per cubic cm) which is at least a 9 times greater increase in dopant activation. Further still, in some embodiments, employing the non-selectively deposited S/D material 262 as variously described herein may allow for the non-selectively deposited semiconductor material to apply at least 1.25, 1.5, 1.75, 2, 2.5, 3, 3.5, 4, 4.5, 5, 6, 7, 8, 9, or 10 times greater strain (e.g., tensile or compressive, as desired) to a corresponding channel region to improve mobility of that channel region and thereby improve device performance. Numerous benefits of employing non-selectively deposited S/D material will be apparent in light of this disclosure.

In some embodiments, selectively deposited S/D material 261 and non-selectively deposited S/D material 262 may both include the same monocrystalline semiconductor material. In some such embodiments, material 261 and 262 may include the same concentration of dopant or different concentrations of dopant. For instance, in some embodiments, non-selectively deposited S/D material 262 may include relatively more dopant as it may be able to chemically include the relatively more dopant, compared to the selectively deposited S/D material 261, due to the non-selective deposition technique(s) employed (such as was previously described). However, even where both of S/D materials 261 and 262 include the same semiconductor material and also both include the same dopant and at the same chemical concentration, the non-selectively deposited S/D material 262 may increase transistor performance because the dopant included in that material 262 is relatively more active than the dopant included in the selectively deposited S/D material 261, due to the non-selective deposition technique(s) employed (as was also previously described). In some embodiments, selectively deposited S/D material 261 and non-selectively deposited S/D material 262 may include compositionally different material such as compositionally different semiconductor material and/or compositionally different dopant. For instance, selectively deposited S/D material 261 may include SiGe with a Ge concentration of approximately 70% and non-selectively deposited S/D material 262 may include SiGe with a Ge concentration of approximately 30%, resulting in materials 261 and 262 being compositionally different. To provide another example, materials 261 and 262 may both include Si, but selectively deposited S/D material 261 may include n-type dopant phosphorous at a concentration of 1E20 atoms per cubic cm, whereas non-selectively deposited S/D material 262 may include n-type dopant phosphorous at a concentration of 1E21 atoms per cubic cm. Numerous variations on the material of a given S/D region will be apparent in light of this disclosure.

As can be understood based on this disclosure, the selectively deposited S/D material 261 (when employed) is significantly formed as monocrystalline semiconductor material in the S/D regions, as it primarily epitaxially grows from exposed semiconductor material seeding surfaces in those regions (such as the top surface of the monocrystalline semiconductor material sub-fin portions 203 shown in FIG. 2G, as previously described). Although the selectively deposited S/D material 216 may insignificantly grow elsewhere (such as some atoms may form on exposed insulator material surfaces), there typically is not a concern with removing that insignificant amount of semiconductor material that grows in areas other than the desired S/D regions. However, the non-selectively deposited S/D material 262 significantly forms on all exposed surfaces, as was previously described. When the non-selectively deposited S/D material 262 forms on monocrystalline semiconductor material (like that included in selectively deposited S/D material 261) that non-selectively deposited S/D material 262 can also form as monocrystalline semiconductor material, which is desired as it is the highest-quality crystalline structure for the semiconductor material in the S/D regions. However, when the non-selectively deposited S/D material 262 forms on insulator material, the non-selectively deposited S/D material 262 forms as amorphous or polycrystalline semiconductor material. Although such an occurrence assists with removing the majority of that amorphous or polycrystalline non-selectively deposited S/D material, if the amorphous or polycrystalline semiconductor material were to remain in undesired areas (e.g., in areas connecting S/D regions in an undesired manner), then it would lead to the electrical shorting of included transistor devices. Therefore, to benefit from the use of non-selectively deposited S/D material 262, that S/D material 262 needs to be removed from areas other than the S/D regions where it is supposed to be located, which is achieved using the masking and selective etching processes described below with reference to boxes 118-122 of method 100A of FIG. 1A.

Figure 2K:
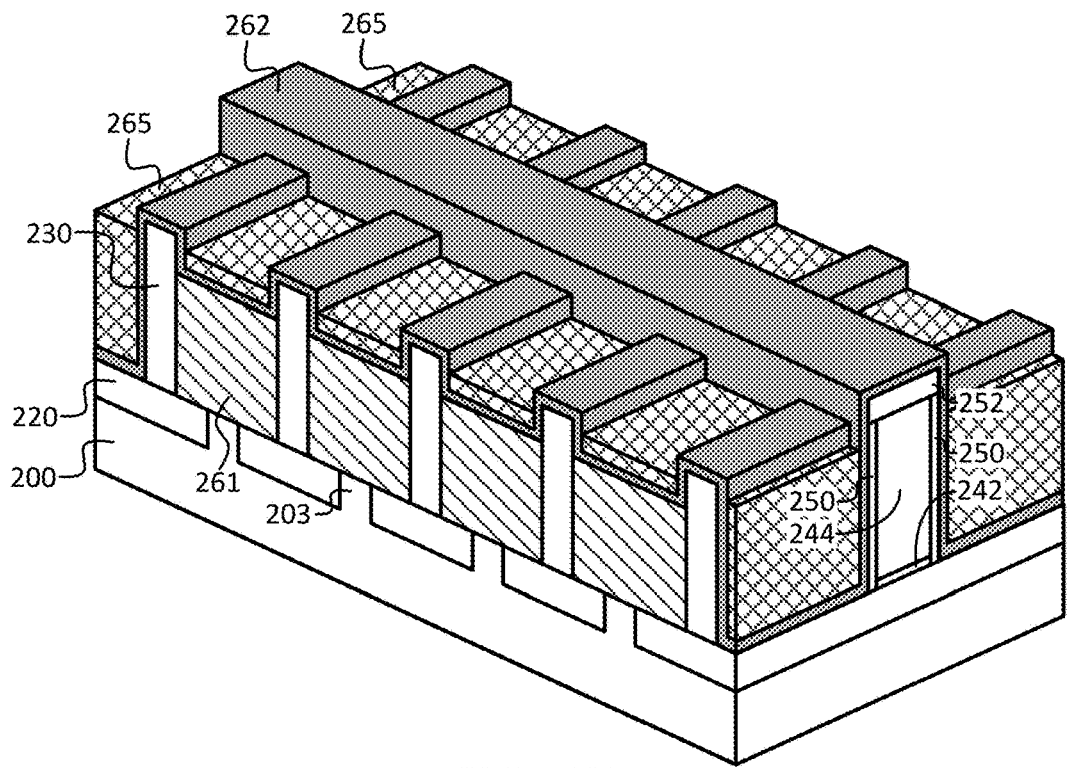

Method 100A of FIG. 1A continues with depositing, planarizing, and recessing 118 hardmask material 265 to form the example resulting structure of FIG. 2K, in accordance with some embodiments. The example structure of FIG. 2J illustrates an intervening structure formed after the hardmask material 265 has been deposited and planarized. In some embodiments, the hardmask 265 material may be deposited using any suitable techniques, such as via CVD, ALD< PVD, spin-on processing, and/or any other suitable process as will be apparent in light of this disclosure. In some embodiments, the hardmask material may then be planarized and/or polished using any suitable techniques, such as CMP processing, for example. Continuing from the example structure of FIG. 2J, the hardmask material 265 may be recessed by etching the material to form the example resulting structure of FIG. 2K. Note that in this example embodiment, the hardmask material 265 was recessed to a level below the top surface of the isolation structures 230 to allow for the removal of the non-selectively deposited S/D material 262 from the top surface of those fin-shaped structures (and also from the top surface of hardmask 252) while allowing the non-selectively deposited S/D material 262 to remain in the S/D regions, as will be described with reference to FIG. 2L, for example. In some embodiments, hardmask 265 may be recessed to any level below the top surface of isolation structures 230, such that there is still hardmask material 265 remaining on the non-selectively deposited S/D material 262 in the S/D regions.

In some embodiments, hardmask 265 may include any suitable material, such as oxide material, nitride material, and/or any other suitable dielectric material, for example. Specific oxide and nitride materials may include silicon oxide, titanium oxide, hafnium oxide, aluminum oxide, silicon nitride, and titanium nitride, just to name a few examples. In some embodiments, hardmask 265 may include at least one of silicon (Si), oxygen (O), nitrogen (N), and carbon (C). In some cases, hardmask material 265 may be selected based on the non-selectively deposited S/D material 262, the material of isolation structures 230, and/or hardmask material 252. For instance, in some embodiments, the hardmask material 265 may be selected to be compositionally different than the material of isolation structures 230, such that after the top surface of isolation structures 230 are exposed (as will be described below), the hardmask material 265 can be selectively etched to remove it without significantly removing material of the isolation structures 230.

Figure 2L:
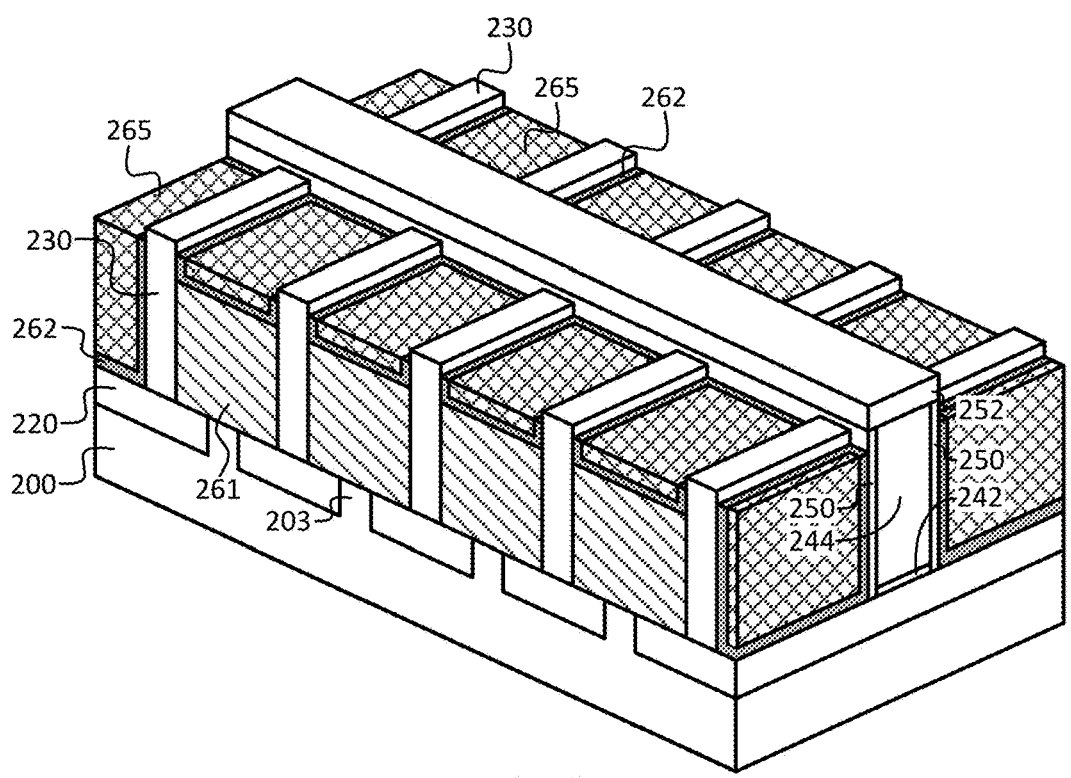

Method 100A of FIG. 1A continues with etching 120 the exposed amorphous (or polycrystalline) S/D material 262 selective to the hardmask material 265 to form the example resulting structure of FIG. 2L, in accordance with some embodiments. In some embodiments, selective etch 120 may be performed using any suitable techniques, such as via wet and/or dry etch processing that includes a given etchant that selectively removes the exposed non-selectively deposited S/D material 262 relative to the hardmask material 265 (e.g., such that the hardmask material 265 is not significantly removed or the non-selectively deposited S/D material 262 is removed at a rate of at least 1.5, 2, 2.5, 3, 4, 5, 10, 15, 20, 50, or 100 times faster relative to the removal of hardmask material 265). Suitable etchants and conditions will be apparent to those in the art based on this disclosure (e.g., based on the particular combination of materials involved). Note that selective etch 120 may also insignificantly remove the material of hardmask 252 and isolation structures 230, in some embodiments, such that when the non-selectively deposited S/D material 262 covering those features is etched away, hardmask 252 and isolation structures 230 do not significantly lose material. In some embodiments, where the non-selectively deposited S/D material 262 is formed with a monocrystalline structure (e.g., on selectively deposited S/D material 261), it may be relatively resistant to selective etch processing 120. Thus, in some such embodiments, hardmask 265 need not even be formed to assist with removing the amorphous (or polycrystalline) non-selectively deposited S/D material 262 relative to the monocrystalline non-selectively deposited S/D material 262 (which is desired to be kept), such that the processing related to hardmask 265 and the structures illustrated in FIGS. 2J-L may not be performed. However, hardmask 265 may be employed in some embodiments to, for example, maintain a relatively high-quality (e.g., sufficiently clean and defect free) top surface of non-selectively deposited S/D material 262 in the S/D regions, in accordance with some embodiments.

Method 100A of FIG. 1A continues with etching 122 hardmask material 265 selective to monocrystalline non-selectively deposited S/D material 262 to form the example resulting structure of FIG. 2M, in accordance with some embodiments. In some embodiments, selective etch 122 may be performed using any suitable techniques, such as via wet and/or dry etch processing that includes a given etchant that selectively removes the hardmask material 265 relative to the non-selectively deposited S/D material 262 (e.g., such that the non-selectively deposited S/D material 262 is not significantly removed or the hardmask material 265 is removed at a rate of at least 1.5, 2, 2.5, 3, 4, 5, 10, 15, 20, 50, or 100 times faster relative to the removal of the non-selectively deposited S/D material 262). Suitable etchants and conditions will be apparent to those in the art based on this disclosure (e.g., based on the particular combination of materials involved). Note that selective etch 122 may also insignificantly remove the material of hardmask 252 and isolation structures 230, in some embodiments, such that when the non-selectively deposited S/D material 262 covering those features is etched away, hardmask 252 and isolation structures 230 do not significantly lose material. Also note that although the material of hardmask 265 was completely consumed during selective etch 122 in this example embodiment, in other embodiments, at least a portion of hardmask material 265 may remain on the IC structure of FIG. 2M.

FIG. 2M' illustrates a blown-out portion of FIG. 2M to illustrate various features of the example structure, in accordance with some embodiments. Note that in the blown-out portion of FIG. 2M', the non-selectively deposited S/D material 262 layer has cross-hatch shading at certain locations, which is indicated with arrow 264. That cross-hatch shaded portion of layer 262 is provided to show the portion of layer 262 that includes semiconductor material having an amorphous (or polycrystalline) structure, as opposed to the non-cross-hatch shaded portion of layer 262, indicated with arrow 263, which includes semiconductor material having a monocrystalline structure. Recall that portions of non-selectively deposited S/D material layer 262 that was formed on the monocrystalline semiconductor material of selectively deposited S/D layer 261 also includes a monocrystalline structure, whereas the portions of non-selectively deposited S/D material layer 262 that was formed on the insulator material surfaces, such as on isolation structures 230, includes an amorphous (or polycrystalline) structure. The remaining portion of amorphous (or polycrystalline) semiconductor material from layer 262 (and indicated in part using arrow 264) remains because hardmask 265 blocked that portion from being etched away during process 120, as can be understood based on this disclosure.

In some embodiments, the monocrystalline non-selectively deposited S/D material (indicated in part with arrow 263 in FIG. 2M') may be formed to have a thickness T (specifically, the dimension in the vertical or Y-axis direction over the selectively deposited S/D material 261, where the non-selectively deposited S/D material 262 grows with a monocrystalline structure) in the range of 4-500 nm (or in the subrange of 4-50, 4-100, 4-200, 4-300, 4-400, 10-50, 10-100, 10-250, 10-500, 50-100, 50-250, 50-500, 100-250, 100-500, or 250-500 nm), or any other suitable value or range as will be apparent in light of this disclosure. In some embodiments, the thickness T of the monocrystalline non-selectively deposited S/D material (indicated in part with arrow 263 in FIG. 2M') may be at least 4, 10, 15, 20, 25, 30, 35, 40, 45, 50, 60, 70, 80, 90, 100, 150, 200, 250, 300, 400, or 500 nm thick, or any other suitable threshold thickness as will be apparent in light of this disclosure. In some embodiments, the selectively deposited S/D material 261 may have a thickness (dimension in the vertical or Y-axis direction) in the range of 10 nm to 2 microns, for example, or any other suitable value or range as will be apparent in light of this disclosure. In some embodiments, the ratio of monocrystalline selectively deposited S/D material 261 to monocrystalline non-selectively deposited S/D material in a given S/D region may be at least or approximately 1, 1.5, 2, 2.5, 3, 3.5, 4, 4.5, 5, 6, 7, 8, 9, 10, 15, 20, 25, 30, 40, or 50, depending on the particular configuration. In embodiments where selectively-deposited S/D material 261 is not employed, the non-selectively deposited S/D material (e.g., 262' in FIG. 2I') may have a relatively larger thickness (dimension in the vertical or Y-axis direction), such as in the range of 20 nm to 2 microns, for example, as the material may be occupying the entirety of a given S/D region, as can be understood based on this disclosure.

Figure 3:
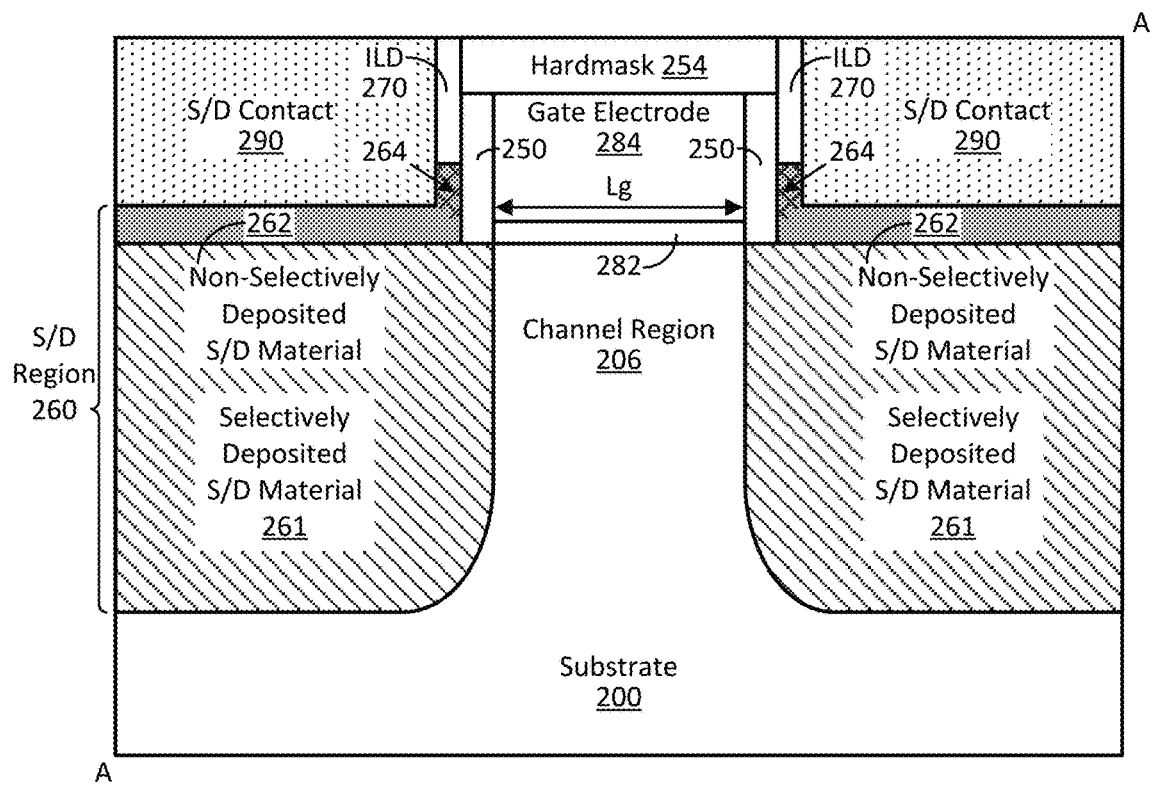
FIG. 3 illustrates an example cross-sectional view along plane A-A in FIG. 2O, in accordance with some embodiments.

FIG. 2M' also includes arrows indicating the top surfaces of different features of the structure. For example, the top surface of isolation structure 230 is indicated using arrow 233, while the top surface of the S/D region 260 that includes monocrystalline semiconductor material is indicated using arrow 263. Note that arrow 263 is used to indicate both monocrystalline semiconductor material of layer 262 (versus the amorphous or polycrystalline semiconductor material of layer 262, which is indicated using arrow 264) and also the top surface of that monocrystalline semiconductor material of layer 262. Also note that an example S/D region 260 is indicated in FIG. 3. Further, the difference in height between the top surfaces 233 and 263 of the two features is indicated as D2. In some embodiments, the difference in height D2 between the top surface of the monocrystalline semiconductor material included in a given S/D region 260 (e.g., which is indicated using arrow 263 in FIG. 2M') and the top surface of its adjacent isolation structure 230 (e.g., which is indicated using arrow 233 in FIG. 2M') may be in the range of 10-200 nm (or in a subrange of 10-50, 10-100, 10-150, 50-100, 50-150, 50-200, 100-150, 100-150, 100-200, or 150-200 nm). In some embodiments, the difference in height D2 (difference in the vertical or Y-axis direction) between the top surfaces 233 and 263 of the two features (the height of the top surface of isolation structure 230 minus the height of the top surface of the adjacent S/D region 260) may be at least 10, 15, 20, 25, 30, 35, 40, 45, 50, 60, 70, 80, 90, 100, 110, 120, 130, 140, 150, 160, 170, 180, 190, or 200 nm, or at least some other suitable threshold value as will be apparent in light of this disclosure. Note that in this example embodiment, the interface between selectively deposited S/D material 261 and non-selectively deposited S/D material 262 is below the top surfaces 233 of isolation structures 230, and thus, any composition change that occurs between the two S/D materials 261 and 262 would also occur below the top surfaces 233 of isolation structures 230.

Method 100A of FIG. 1A continues with performing 124 final gate stack processing to form the example resulting structure of FIG. 2N, in accordance with some embodiments. As shown in FIG. 2N, the processing in this example embodiment included depositing interlayer dielectric (ILD) material 270 on the structure of FIG. 2M, followed by planarization and/or polish (e.g., CMP) processing to gain access to hardmask 254 and to ultimately gain access to the dummy gate stack. Note that ILD layer 270 is shown as transparent in the example structure of FIG. 2N to allow for the underlying features to be seen; however, the present disclosure is not intended to be so limited. Also note that ILD layer 270 may include a multilayer structure, even though it is illustrated as a single layer. Further note that in some cases, ILD layer 270 and STI material 220 may not include a distinct interface as shown in FIG. 2N, particularly where, e.g., the ILD layer 270 and STI material 220 include the same dielectric material. In some embodiments, the ILD layer 270 may include any suitable electrical insulator, dielectric, oxide (e.g., silicon oxide), and/or nitride (e.g., silicon nitride) material(s), as will be apparent in light of this disclosure. The gate stack processing, in this example embodiment, continued with removing the dummy gate stack (including dummy gate electrode 244 and dummy gate dielectric 242) to allow for the final gate stack or structure to be formed. Recall that in some embodiments, the formation of the final gate stack, which includes gate dielectric 282 and gate electrode 284, may be performed using a gate first flow (also called up-front hi-k gate flow). In such embodiments, the final gate processing may have alternatively been performed at box 110 of FIG. 1A. However, in this example embodiment, the gate stack is formed using a gate last flow (also called a replacement gate or replacement metal gate (RMG) process). Regardless of whether gate first or gate last processing is employed, the final gate stack can include gate dielectric 282 and gate electrode 284 as shown in FIG. 2N and described herein.

Note that when the dummy gate is removed, the channel region of fins 204 (that were covered by the dummy gate) are exposed to allow for any desired processing of the channel regions of the fins. Such processing of the channel region may include various different techniques, such as removing and replacing the channel region with replacement material, doping the channel region of the fin as desired, forming the fin into one or more nanowires (or nanoribbons) for a gate-all-around (GAA) transistor configuration, cleaning/polishing the channel region, and/or any other suitable processing as will be apparent in light of this disclosure. For instance, finned channel region 206 is illustrated in FIG. 2N (which is the channel region of the second right-most of the four original finned structures) and that finned channel region may or may not include material native to substrate 200 (e.g., it may be the originally formed fin or it may have been removed and replaced, such as was the case for replacement fin 202'), and in addition, it may or may not have been processed further in any suitable manner (e.g., removed and replaced with replacement material, doped in a desired manner, converted into nanowires or nanoribbons, etc.). For example, nanowire channel region 208 (which is the channel region of the left-most of the four original finned structures) may have been formed after the dummy gate was removed and the channel regions of the fins were exposed, by converting the finned structure at that location into the nanowires 208 shown using any suitable techniques know to those in the art, for example. For instance, the original finned channel region may have included a multilayer structure, where one or more of the layers included sacrificial material that was selectively etched to remove those sacrificial layers and release the nanowires 208 as shown. In the example embodiment of FIG. 2N, nanowire channel region 208 includes 2 nanowires (or nanoribbons) in this example case. However, a nanowire (or nanoribbon or GAA) transistor formed using the techniques disclosed herein may include any number of nanowires (or nanoribbons) such as 1, 3, 4, 5, 6, 7, 8, 9, 10, or more, depending on the desired configuration.

As can be understood based on this disclosure, the channel region is at least below the gate stack, in this example embodiment. For instance, in the case of a finned transistor configuration, the channel region may be below and between the gate stack, as the stack is formed on three sides as is known in the art. However, if the transistor device were inverted and bonded to what will be the end substrate, then the channel region may be above the gate. Therefore, in general, the gate and channel relationship may include a proximate relationship (which may or may not include one or more intervening gate dielectric layers and/or other suitable layers), where the gate is near the channel region such that it can exert control over the channel region in some manner (e.g., in an electrical manner), in accordance with some embodiments. Further, in the case of a nanowire (or nanoribbon or GAA) transistor configuration, the gate stack may completely surround each nanowire/nanoribbon in the channel region (or at least substantially surround each nanowire, such as surrounding at least 70, 80, or 90% of each nanowire). In some embodiments, a nanowire or nanoribbon may be considered fin-shaped where the gate stack wraps around each fin-shaped nanowire or nanoribbon in a GAA transistor configuration. Further still, in the case of a planar transistor configuration, the gate stack may simply be above the channel region. In some embodiments, a given channel region may include group IV semiconductor material (e.g., Si, SiGe, Ge), group III-V semiconductor material (e.g., GaAs, InGaAs, InAs), and/or any other suitable material as will be apparent in light of this disclosure. In some embodiments, a given channel region may be doped (e.g., with any suitable n-type and/or p-type dopant) or intrinsic/undoped (or nominally undoped, including dopant concentrations of less than 1E16 atoms per cubic cm, for example), depending on the particular configuration.

Note that the S/D regions 260 (which include selectively deposited S/D material 261 and non-selectively deposited S/D material 262, in this example embodiment) are adjacent to either side of a corresponding channel region, as can be seen in FIG. 2N, for example. More specifically, a given S/D region 260 is at least in part directly adjacent to a corresponding channel region, such that there are no intervening layers between the given S/D region 260 and the corresponding channel region (e.g., channel region 206), in this example embodiment. However, the present disclosure is not intended to be so limited. Also note that the configuration/geometry of a transistor formed using the techniques described herein may primarily be described based on the shape of the respective channel region of that transistor. For instance, a nanowire (or nanoribbon or GAA) transistor may be referred to as such because it includes one or more nanowires (or nanoribbons) in the channel region of that transistor and because the gate stack (including the gate) wraps around (or at least substantially wraps around) each nanowire (or nanoribbon). However, the transistor type (e.g., MOSFET, TFET, FFFET, or other suitable type) may be described based on the doping and/or operating scheme of the source, channel, and drain regions, and thus those respective regions may be used to determine the type or classification of a given transistor, for example. For instance, MOSFET and TFET transistors may be structurally very similar (or the same), but they include different doping schemes (e.g., source-drain doping schemes for MOSFET of p-p or n-n versus p-n or n-p for TFET).

Continuing with performing 124 final gate stack processing, after the dummy gate has been removed and any desired channel region processing has been performed, the final gate stack can then be formed, in accordance with some embodiments. In this example embodiment, the final gate stack includes gate dielectric 282 and gate electrode 284, as shown in FIG. 2N. The gate dielectric 282 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric 282 to improve its quality when high-k dielectric material is used. The gate electrode 284 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate dielectric 282 and/or gate electrode 284 may include a multilayer structure of two or more material layers, for example. In some embodiments, gate dielectric 282 and/or gate electrode 284 may include grading (e.g., increasing and/or decreasing) of the content/concentration of one or more materials in at least a portion of the feature(s). Additional layers may be present in the final gate stack, in some embodiments, such as one or more work function layers or other suitable layers, for example. Note that although gate dielectric 282 is only shown below gate electrode 284 in the example embodiment of FIG. 2N, in other embodiments, the gate dielectric 282 may also be present on one or both sides of gate electrode 284, such that the gate dielectric 282 may also be between gate electrode 284 and one or both of spacers 250, for example. Numerous different gate stack configurations will be apparent in light of this disclosure.

Figure 2O:
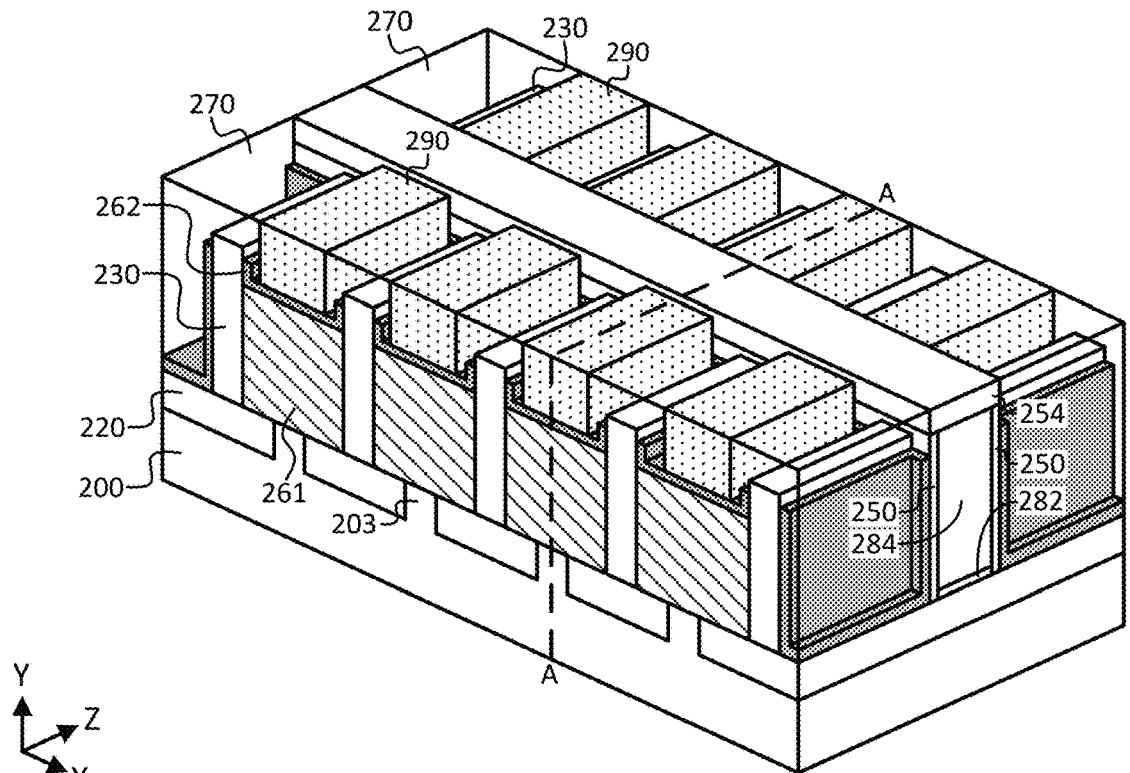

Method 100A of FIG. 1A continues with performing 126 S/D contact processing to form the example resulting structure of FIG. 2O, in accordance with some embodiments. In some embodiments, S/D contact processing 126 first includes forming S/D contact trenches above the S/D regions 260. In some such embodiments, the contact trenches may be formed using any suitable techniques, such as performing one or more wet and/or dry etch processes to remove portions of ILD layer 270 and/or any other suitable processing as will be apparent in light of this disclosure. Such etch processing may be referred to herein as the S/D contact trench etch processing, or simply, contact trench etch processing. Further, in some such embodiments, the ILD may first be patterned such that areas that are not to be removed via the contact trench etch processing are masked off, for example. The S/D contact processing then includes forming S/D contact structures 290 above and in electrical (and possibly also in physical) contact with respective S/D regions 260, in accordance with some embodiments. In some embodiments, S/D contact structures 290 may be formed using any suitable techniques, such as depositing metal or metal alloy (or other suitable electrically conductive material) in the previously formed contact trenches. In some embodiments, S/D contact structure 290 formation may include silicidation, germanidation, III-V-idation, and/or annealing processes, for example. In some embodiments, S/D contacts 290 may include aluminum or tungsten, although any suitable conductive metal or alloy can be used, such as silver, nickel-platinum, or nickel-aluminum, for example. In some embodiments, one or more of the S/D contact structures 290 may include a resistance reducing metal and a contact plug metal, or just a contact plug, for instance. Example contact resistance reducing metals include, for instance, nickel, aluminum, titanium, gold, gold-germanium, nickel-platinum, or nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact regions, such as adhesion layers (e.g., titanium nitride) and/or liner or barrier layers (e.g., tantalum nitride), if so desired.

FIG. 3 illustrates an example cross-sectional view along plane A-A in FIG. 2O, in accordance with some embodiments. The cross-sectional view of FIG. 3 is provided to assist in illustrating different features of the structure of FIG. 2O. Therefore, the previous relevant description with respect to each similarly numbered feature is equally applicable to FIG. 3. However, note that the dimensions of the features shown in FIG. 3 may differ relative to the features in FIG. 2O, for ease of illustration. Also note that some variations occur between the structures, such as the shape of finned channel region 206 and the selectively deposited S/D material 261 extending under spacers 250, for example. As shown in FIG. 3, the S/D region 260 is indicated on the left side of the structure, which includes the monocrystalline semiconductor material of selectively deposited S/D material 261 and non-selectively deposited S/D material 262, in this example embodiment. In some embodiments, the length of gate electrode 284 (e.g., the dimension between spacers 250, or between contact structures 291 and 292, in the Z-axis direction), which is indicated as Lg, may be any suitable length as will be apparent in light of this disclosure. For instance, in some embodiments, the gate length may be in the range of 3-100 nm (e.g., 3-10, 3-20, 3-30, 3-50, 5-10, 5-20, 5-30, 5-50, 5-100, 10-20, 10-30, 10-50, 10-100, 20-30, 20-50, 20-100, or 50-100 nm), or any other suitable value or range as will be apparent in light of this disclosure. In some embodiments, the gate length may be less than a given threshold, such as less than 100, 50, 45, 40, 35, 30, 25, 20, 15, 10, 8, or 5 nm, or less than some other suitable threshold as will be apparent in light of this disclosure. In some embodiments, the techniques enable maintaining a desired device performance when scaling to such low gate length Lg thresholds, such as sub-50, sub-40, sub-30, or sub-20 nm thresholds, as can be understood based on this disclosure. Further, the techniques described herein may allow the gate length and the effective channel length (dimension between the S/D regions in the Z-axis direction) to be the same or approximately the same, in accordance with some embodiments. Thus, the gate length may approximate the effective channel length, in some such embodiments.

Method 100A of FIG. 1A continues with completing 128 integrated circuit (IC) processing as desired, in accordance with some embodiments. Such additional processing to complete the IC may include back-end or back-end-of-line (BEOL) processing to form one or more metallization layers and/or to interconnect the transistor devices formed during front-end or front-end-of-line (FEOL) processing, for example. Any other suitable processing may be performed, as will be apparent in light of this disclosure. Note that the processes 102-128 of method 100A are shown in a particular order for ease of description. However, one or more of the processes 102-128 may be performed in a different order or may not be performed at all. For example, boxes 110, 112, and 114 are optional processes that need not be performed in some embodiments. For instance, in embodiments employing a gate first process flow, the alternative method flow illustrated using 100A' may be implemented, where box 124 is instead performed at the location of box 110, to provide an example. Numerous variations on method 100A and the techniques described herein will be apparent in light of this disclosure. Recall that the techniques may be used to form a multitude of different transistor types and configurations. Although the techniques are primarily depicted and described herein in the context of employing non-selectively deposited S/D material for both of the S/D regions of a given transistor, the present disclosure is not intended to be so limited, as the techniques may be used to benefit only one S/D region of a given transistor, and not the other, in some embodiments.

FIG. 1B illustrates method 100B of forming an IC including at least one transistor employing non-selective deposition of S/D material, in accordance with some embodiments. Recall that method 100B (and the structures formed therefrom) is similar to method 100A (and the structures formed therefrom), except that method 100A includes up-front processing of isolation structures and non-selectively deposited S/D material, such as prior to forming a final gate stack (e.g., in embodiments including a gate last process flow), whereas method 100B includes forming isolation structures and non-selectively deposited S/D material during S/D contact loop processing, such as after forming a final gate stack. Therefore, the previous relevant description of method 100A and its processes 102-128 is equally applicable to method 100B and its processes 102-128. Moreover, the previous relevant description with respect to FIGS. 2A-2O and the features of the illustrated structures is equally applicable to FIGS. 4A-4L and the features of the illustrated structures. Thus, in the description of method 100B below, the differences between methods 100A and 100B will primarily be described below.

Method 100B of FIG. 1B includes patterning 102 a substrate (or channel material layer) into fins, filling 104 trenches between the fins with STI material and polishing/planarizing, and recessing 106 the STI material, as was performed in method 100A, to form the example resulting structure of FIG. 2D, in accordance with some embodiments. The structure of FIG. 2D is copied as the structure of FIG. 4A to illustrate the resulting structure after processes 102, 104, and 106 have been performed. Method 100B digresses from method 100A at this stage, as method 100A included up-front processing of isolation structure 230. However, method 100B of FIG. 1B continues with optional process 110 to form a dummy gate stack and thereby form the example resulting structure of FIG. 2B, in accordance with some embodiments. All previous relevant description with respect to process 110 and forming a dummy gate stack (including dummy gate dielectric 242 and dummy gate electrode 244) is equally applicable here. However, note that hardmask 252 was not formed in this example embodiment. Also note that method 100B is primarily being described in a gate last process flow to allow for such a flow (which typically includes additional processing) to be adequately described. Note that in some embodiments, as previously described, the techniques described herein need not include forming a dummy gate stack, such that a final gate stack may be formed in the first instance (e.g., where dummy gate electrode 244 and dummy gate dielectric 242 would instead be final gate electrode 284 and final gate dielectric 282 in the structure of FIG. 4B). Such an alternative gate first process flow is illustrated in FIG. 1B using alternative flow 100B', where performing 124 the final gate stack processing would alternatively occur at the location of box 110, for example.

Figure 4A:
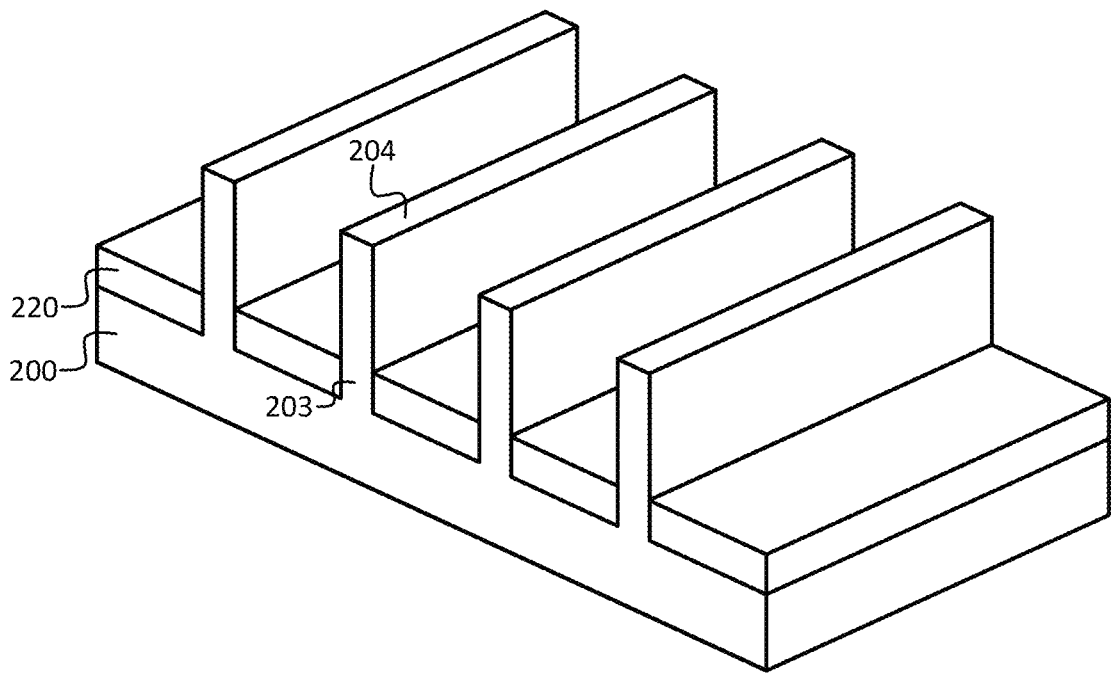
Figure 4B:
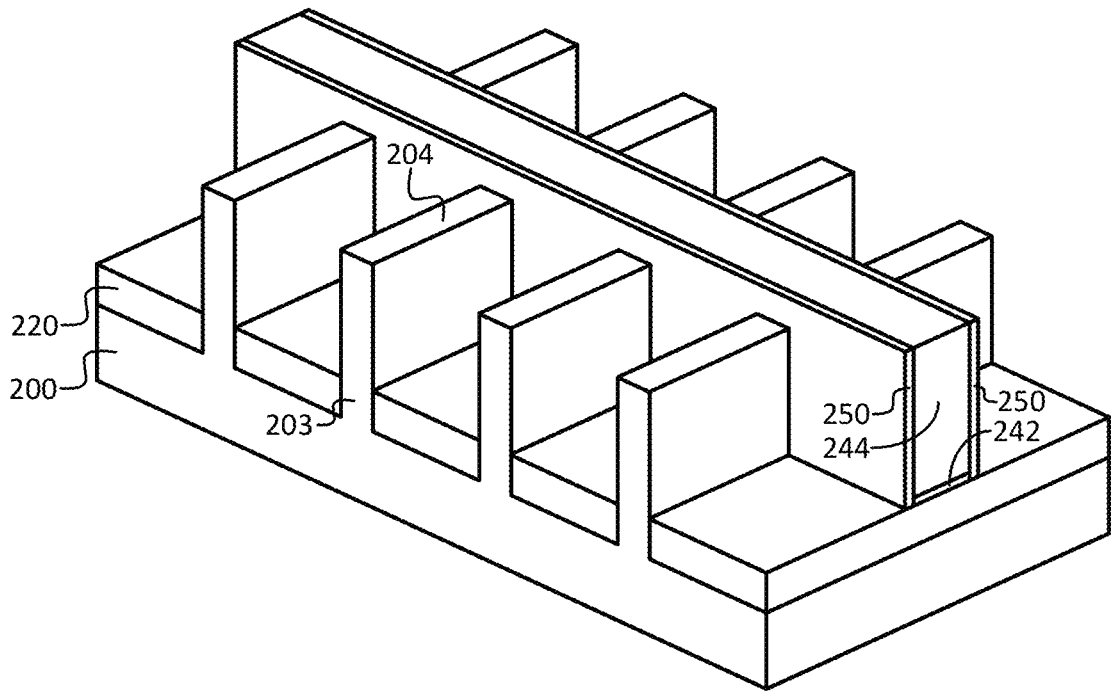
Figure 4C:
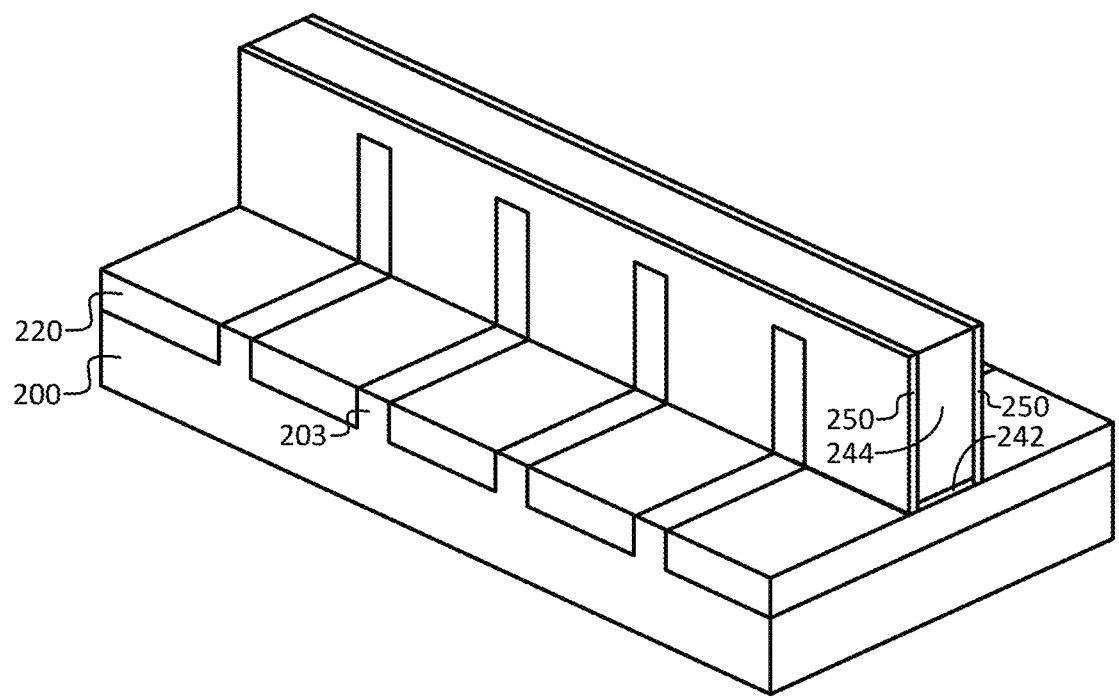
Figure 4D:
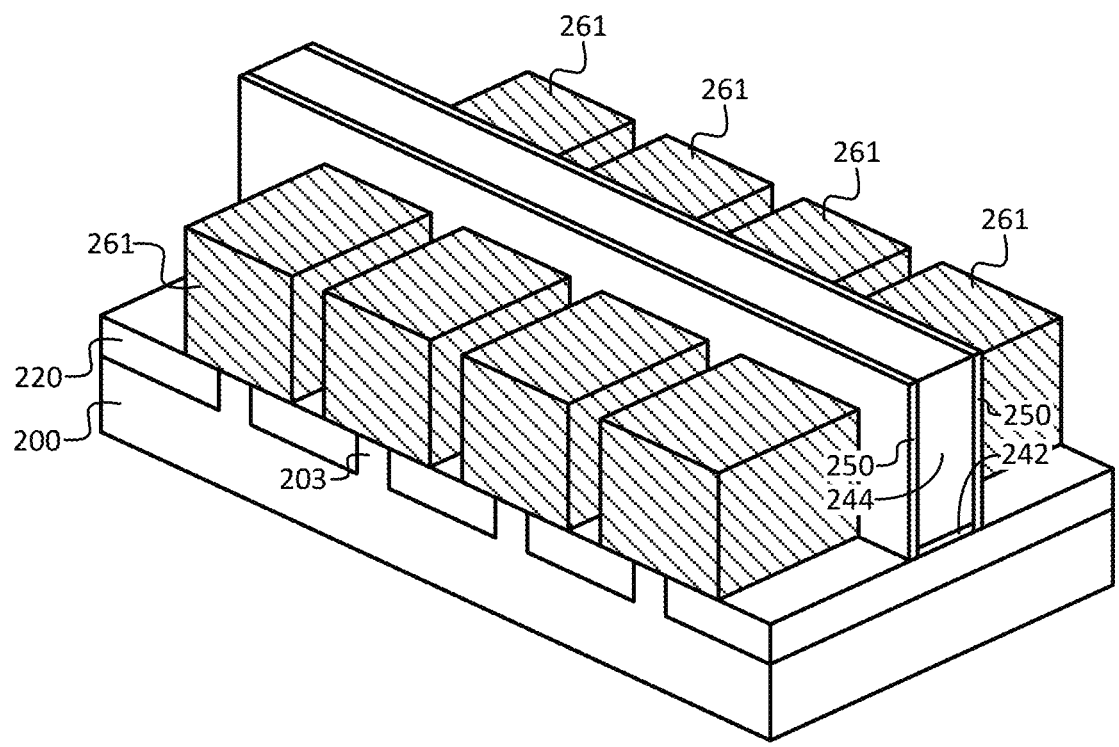
Figure 4E:
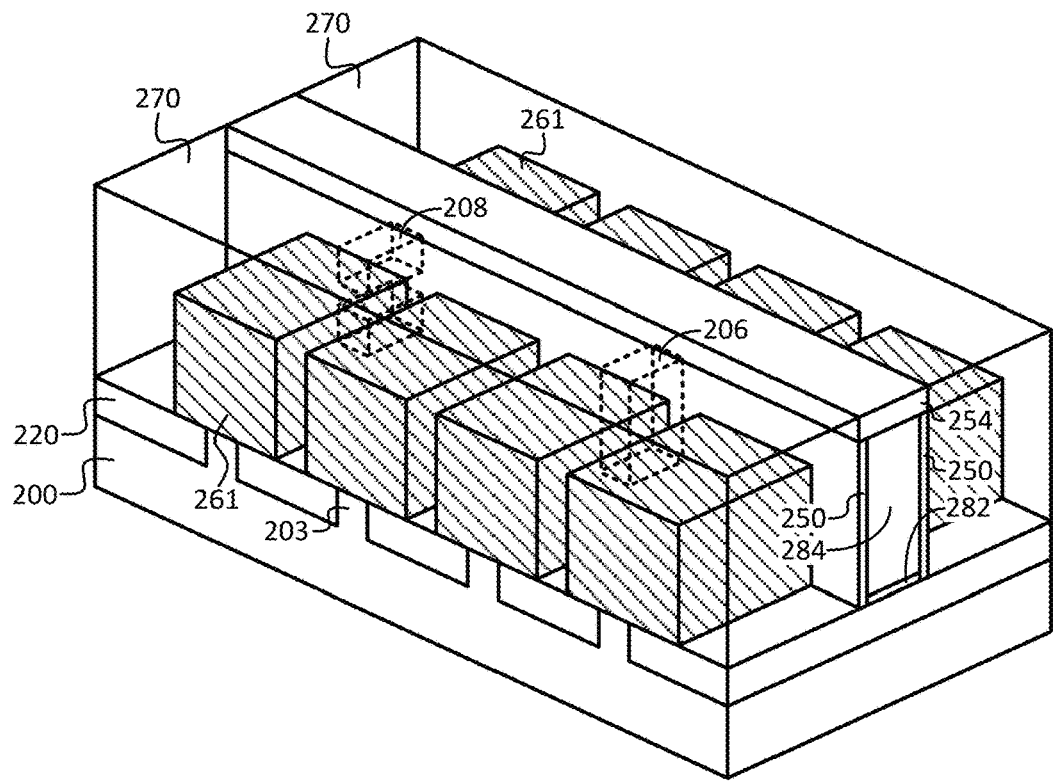

Method 100B of FIG. 1B continues with optionally etching 112 the native fins 204 in the S/D regions to expose locations for the S/D material deposition, thereby forming the example resulting structure of FIG. 4C, in accordance with some embodiments. Recall that process 112 is optional because in some embodiments, process 112 need not be performed, such as when forming S/D material on native fins 204 (and/or replacement fins, such as 202', where employed) in a cladding scheme, for instance (e.g., see FIG. 2H'). Method 100B of FIG. 1B continues with optionally selectively depositing 114 S/D material 261 to form the example resulting structure of FIG. 4D, in accordance with some embodiments. This selective deposition process 114 is optional in method 100B in embodiments where the native fins 204 (and/or replacement fins) are not removed, such that those native (and/or replacement) fins provide a template for subsequent processing. However, if process 112 is performed, then process 114 is also performed to provide a template for subsequent processing (e.g., to be able to form isolation structures between adjacent S/D regions).

Method 100B of FIG. 1B continues with performing 124 final gate stack processing to form the example resulting structure of FIG. 4E, in accordance with some embodiments. Note that even in gate first process flows, ILD 270 is still deposited at this point in method 100B to be able to subsequently form isolation structures 231 and 232; however, the final gate stack would have already been formed, such that hardmask 254 need not be located on the final gate stack and ILD 270 may be formed over the entire structure, for example. In such an example case, ILD 270 may be one continuous layer on top of the entirety of the IC structure of FIG. 4E, for example. Recall that ILD material 270 is shown as transparent to assist with seeing underlying features, such as the underlying features in the structure of FIG. 4E.

Figure 4F:
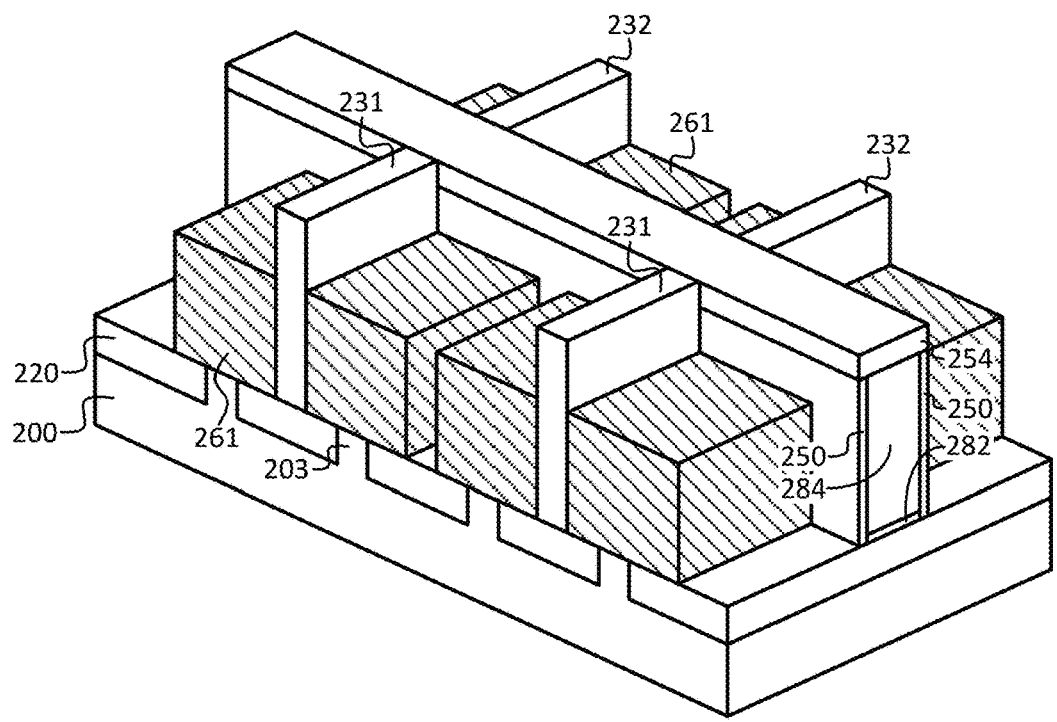
Figure 4I:
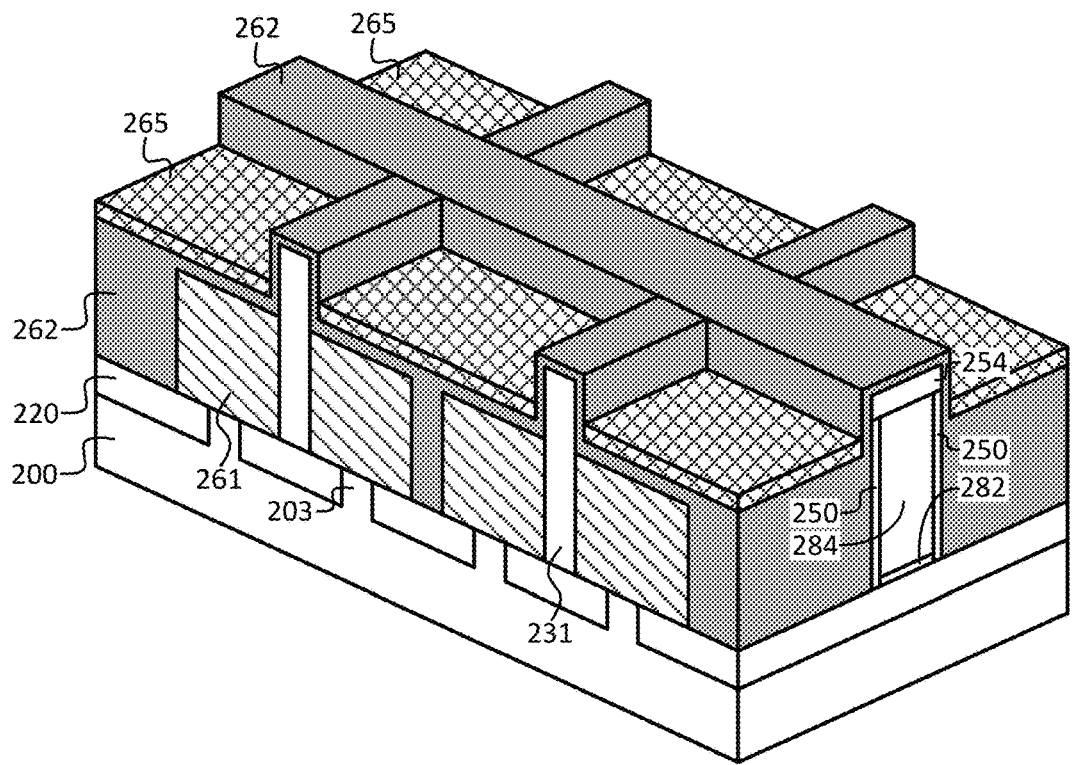
Figure 4J:
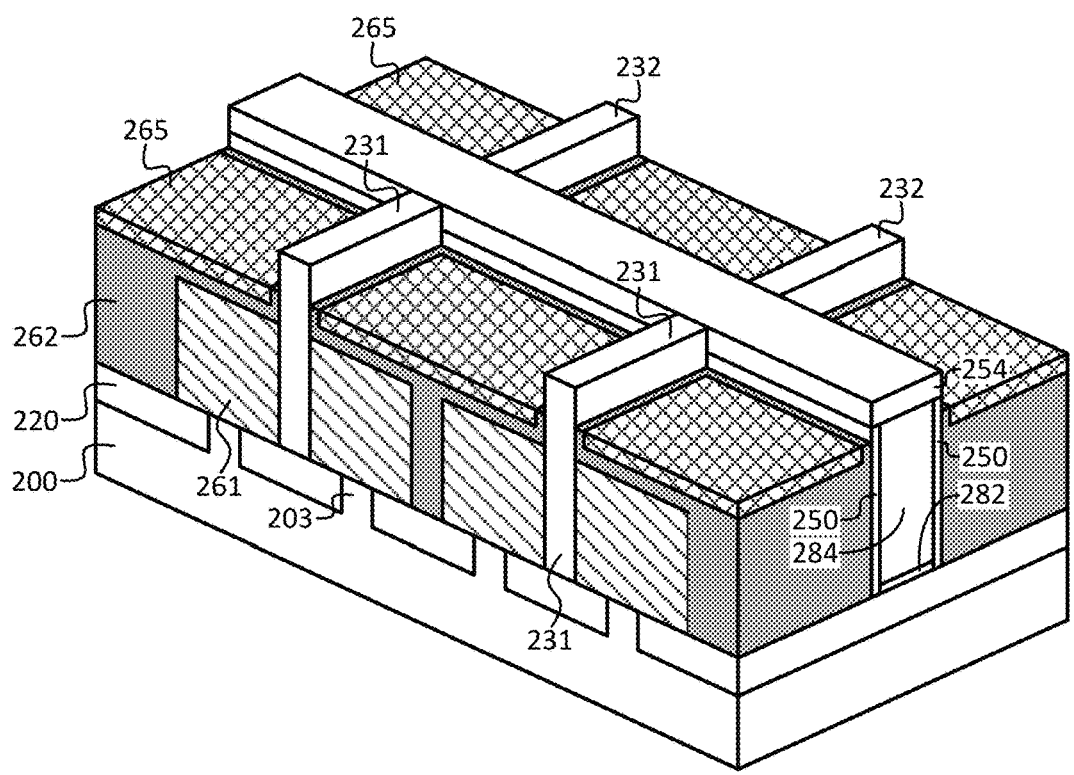
Figure 4K:
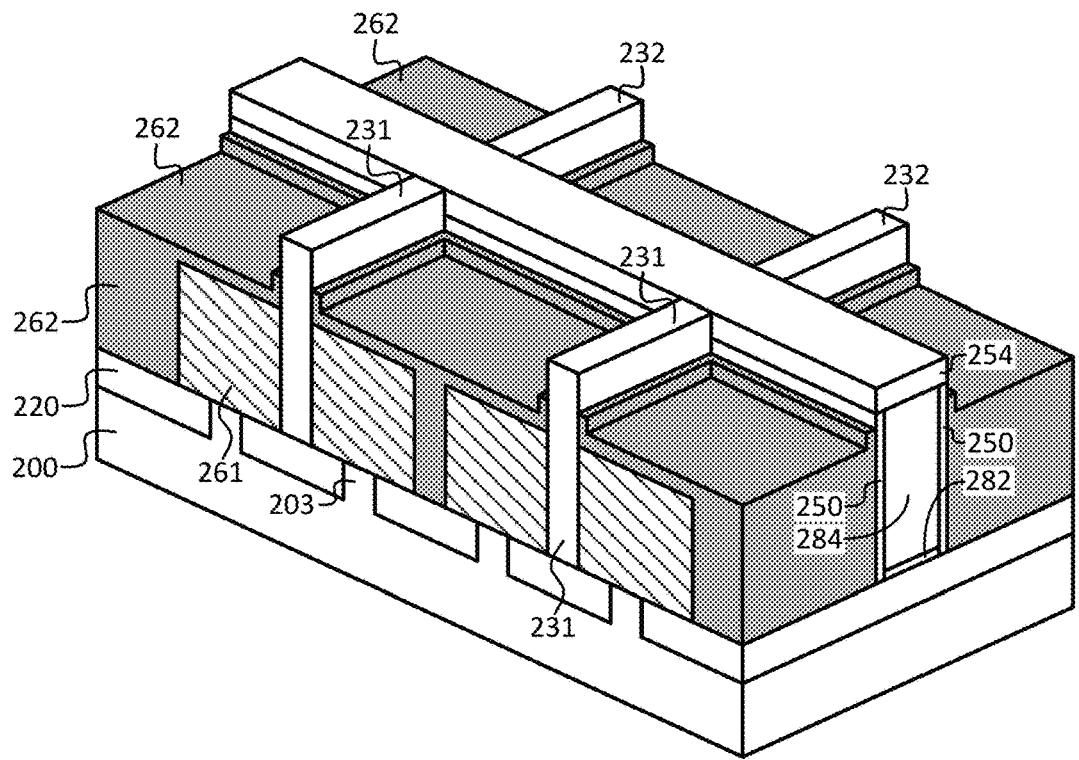

Method 100B of FIG. 1B continues with forming 115 S/D contact trenches including isolation structures 231 and 232, thereby forming the example resulting structure of FIG. 4F, in accordance with some embodiments. In this example embodiment, ILD layer 270 was patterned and etched to form isolation structures 231 and 232, which can be performed using any suitable techniques as can be understood based on this disclosure. As shown in FIG. 4F, isolation structures 231 and 232 were only desired between the left-most S/D regions and the second left-most S/D regions as well as the right-most S/D regions and the second right-most S/D regions. Therefore, in this example embodiment, it is intended that the middle two S/D regions are to be electrically connected via the non-selectively deposited S/D material 262 as will be apparent in light of this disclosure. Note that isolation structures 231 and 232 include the material of ILD layer 270, as they were formed from ILD layer 270 in FIG. 4E, but the material of those structures 231 and 232 was changed from transparent to opaque for illustrative purposes. Also note that although selectively deposited S/D material 261 is formed as rectangular blocks in the S/D regions, the present disclosure is not intended to be so limited. For example, in some embodiments, the selectively deposited S/D material 261 in a given S/D region may have a rounded or curved top surface, more-so resembling a hill, or it may have a three-dimensional diamond shape (e.g., with various different faceting on the top surfaces, such as {111} faceting), or it may have any other suitable shape as will be apparent in light of this disclosure. In such embodiments, isolation structures 231 and 232 may not have the rectangular fin shape shown in FIG. 4F, but may instead have a shape that is still fin-shaped but also conformal to the semiconductor material structures of the adjacent S/D regions, as can be understood based on this disclosure.

Isolation structures 231 and 232 are similar to isolation structures 230, and thus, all previous relevant description is equally applicable. However note that a difference between isolation structures 231 and 232 compared to isolation structures 230 is that, because isolation structures 230 were formed up-front in the process flow, they also are adjacent a given channel region and/or present between the channel regions of adjacent transistors (and are located under the gate stack), as previously described. In the embodiment of FIG. 4F, isolation structures 231 and 232 do not extend under the gate stack and are thus not adjacent a given channel region nor are they located between adjacent channel regions, for example. Another difference is that, for a given vertical, Z-Y axis plane, the isolation structures 231 and 232 on either side of the gate stack are distinct in the example embodiment of FIG. 4F (as opposed to the isolation structure 230 not being distinct in a given vertical, Z-Y axis plane when forming such structures using method 100A). Note that distinct as used herein with respect to two isolation structures includes that the two isolation structures are not physically connected, such that there is a break in the material between the two isolation structures. Also note that in some embodiments, such as those employing a gate first flow, ILD material 270 may be formed over the final gate stack (e.g., hardmask 254 may instead be ILD material 270, as the ILD material was not removed to form the final gate stack in FIG. 4E as it was already formed), such that isolation structures 231 and 232 may be physically connected and not completely distinct. Regardless, in such embodiments, the isolation structures 231 and 232 still would not extend under the final gate stack or be adjacent a given channel region, as can be understood based on this disclosure.

Further note that the up-front isolation structure processing of method 100A was primarily illustrated with the isolation structures 230 being formed such that only one fin 204 is between each pair of isolation structures 230, in a 230-204-230-204-230-204-230-204-230 scheme as shown in FIG. 2E. However, regardless of whether the isolation structures are formed during up-front processing (e.g., as described in method 100A) or contact loop processing (e.g., as described in method 100B), the processing may include forming a given pair of isolation structures such that any number (e.g., 1-10 or more) of original fins 204 (or features that have replaced portions of those fins 204) may be between the given pair of isolation structures without any additional intervening isolation structures being between that given pair of isolation structures. For instance, FIG. 2E' illustrates a variation on method 100A where two fins 204 were formed between a given pair of isolation structures 230' without any additional isolation structures between that given pair of isolation structures 230', in a 230'-204-204-230' scheme as shown in FIG. 2E'. In addition, method 100B illustrates where two selectively deposited S/D regions 261 (that replaced portions of fins 204) are between each set of isolation structures 231 and 232 without any additional intervening isolation structures between either of the sets, in 231-261-261-231 and 232-261-261-232 schemes, respectively, as shown in FIG. 4F. Moreover, just as the up-front isolation structure processing of method 100A may include having multiple fins 204 between a given set of isolation structures (such as was shown in FIG. 2E'), the contact loop isolation structure processing of method 100B may include having only one selectively deposited S/D region 261 between a given set of isolation structures (e.g., if an isolation structure 231 was also formed between the middle-two selectively deposited S/D regions 261 in FIG. 4F), in accordance with some embodiments. Numerous variations on the isolation structures employed using the techniques described herein will be apparent in light of this disclosure.

Method 100B of FIG. 1B continues with non-selectively depositing 116 S/D material 262 to form the example resulting structure of FIG. 4G, in accordance with some embodiments. The previous relevant description with respect to non-selectively deposited S/D material 262 is equally applicable here. However note that a difference between the structure of FIGS. 4G and 2I includes that the non-selectively deposited S/D material 262 is formed between selectively deposited S/D material 261 regions as shown in FIG. 4G, to electrically connect those regions. Also note that the non-selectively deposited S/D material 262 may be relatively thicker than shown in FIG. 4G in regions over the selectively deposited S/D material 261, isolation structures 231 and 232, and the gate stack or hardmask 254 to allow for the non-selectively deposited S/D material to adequately fill the trench between the middle-two S/D regions (between the middle-two structures formed from material 261), however, the structure was provided as shown for ease of illustration. Method 100B of FIG. 1B continues with depositing, planarizing, and recessing 118 hardmask material 265 to form the example resulting structure of FIG. 4I, in accordance with some embodiments. The example structure of FIG. 4H illustrates an intervening structure formed after the hardmask material 265 has been deposited and planarized. Method 100B of FIG. 1B continues with etching 120 the exposed amorphous (or polycrystalline) S/D material 262 selective to the hardmask material 265 to form the example resulting structure of FIG. 4J, in accordance with some embodiments. Method 100B of FIG. 1B continues with etching 122 hardmask material 265 selective to monocrystalline non-selectively deposited S/D material 262 to form the example resulting structure of FIG. 4K, in accordance with some embodiments. Recall that the previous relevant description with respect to processes 116-122 for method 100A is equally applicable to method 100B.

Figure 4L:
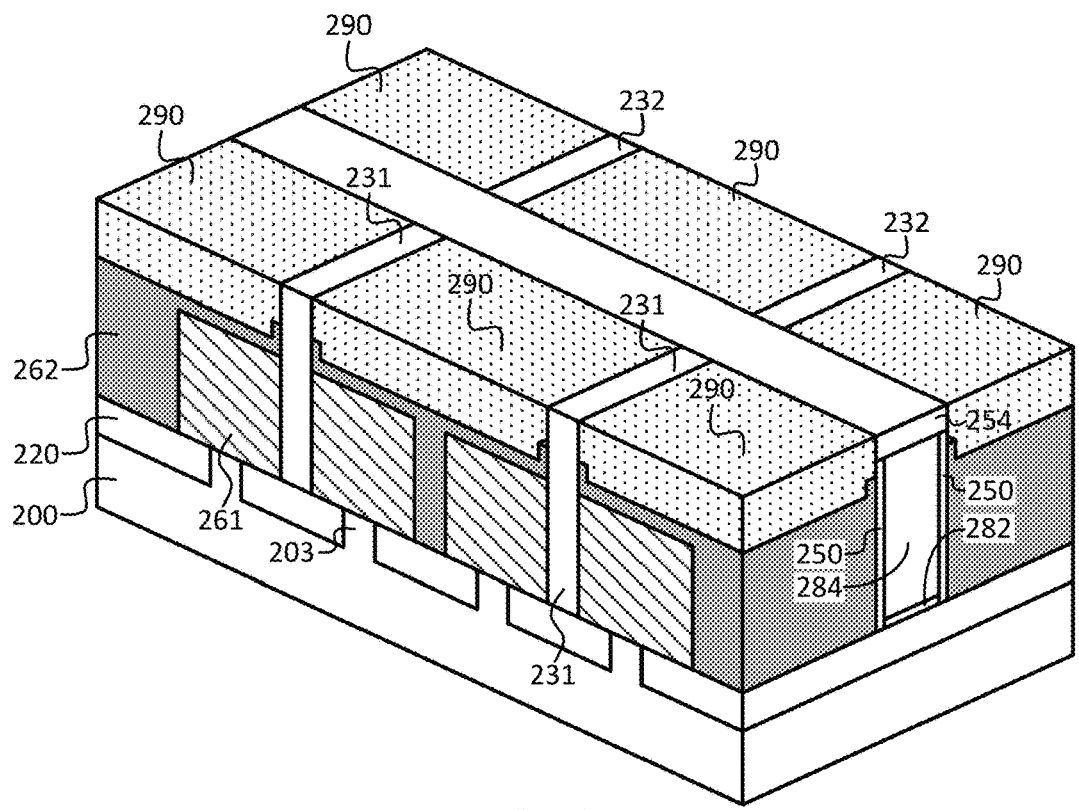
Figure 5:
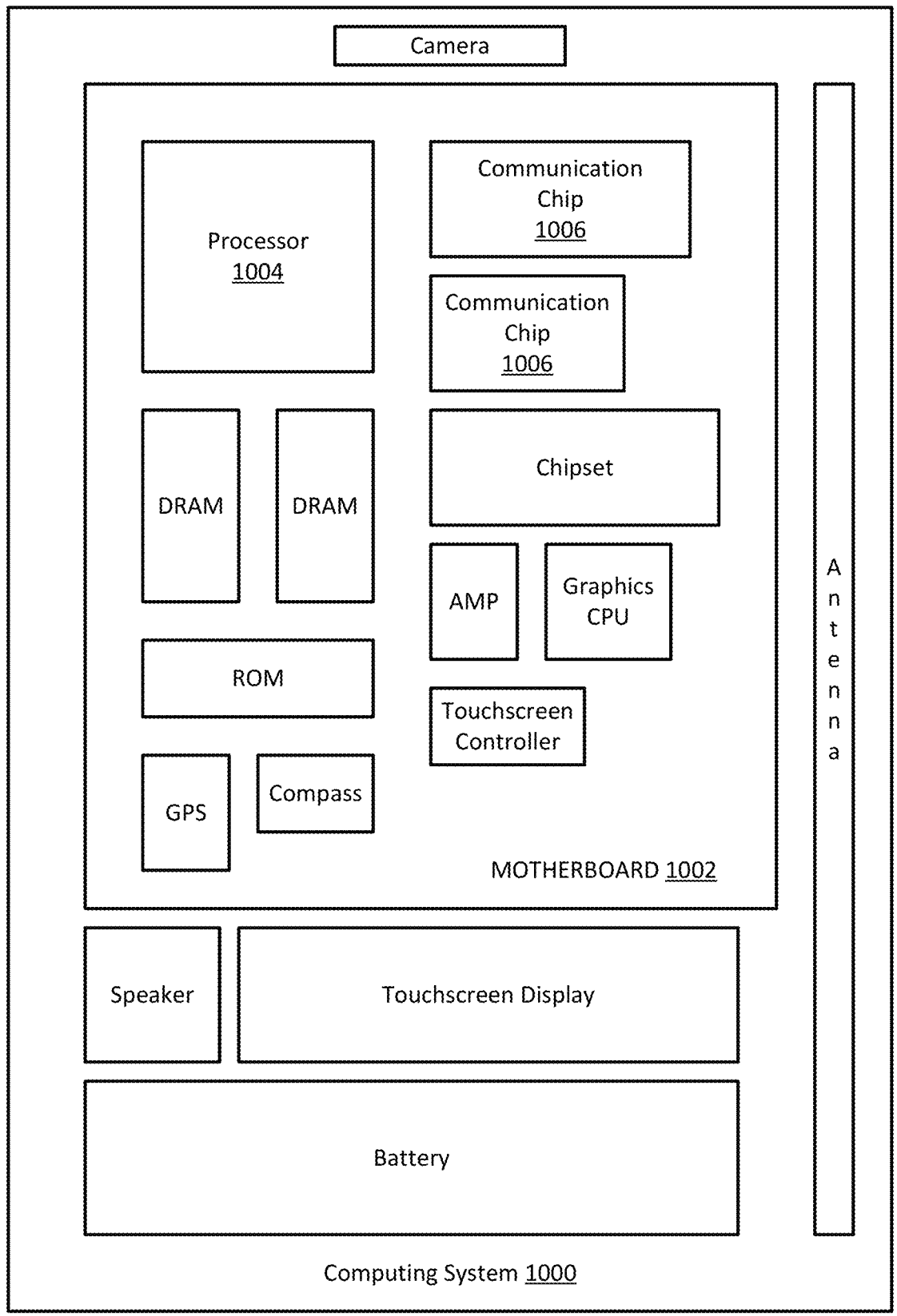
FIG. 5 illustrates a computing system implemented with integrated circuit structures and/or transistor devices formed using the techniques disclosed herein, in accordance with some embodiments of the present disclosure.

Method 100B of FIG. 1B continues with performing 126 S/D contact processing to form the example resulting structure of FIG. 4L, in accordance with some embodiments. Note that in this example embodiment, isolation structures 231 and 232 define contact trenches in which S/D contact material 290 was deposited. However, in other embodiments, another layer of ILD material may be deposited over the structure of FIG. 4K, followed by contact trench etch and contact deposition to form the final S/D contact structures, such that the S/D contact structures need not be in physical contact with isolation structures 231 and 232. Method 100B of FIG. 1B continues with completing 128 integrated circuit (IC) processing as desired, in accordance with some embodiments. Recall that such additional processing to complete the IC may include back-end or back-end-of-line (BEOL) processing to form one or more metallization layers and/or to interconnect the transistor devices formed during front-end or front-end-of-line (FEOL) processing, for example. Any other suitable processing may be performed, as will be apparent in light of this disclosure. Note that the processes 102-128 of method 100B are shown in a particular order for ease of description. However, one or more of the processes 102-128 may be performed in a different order or may not be performed at all. For example, boxes 110, 112, and 114 are optional processes that need not be performed in some embodiments. For instance, in embodiments employing a gate first process flow, the alternative method flow illustrated using 100B' may be implemented, where box 124 is instead performed at the location of box 110, to provide an example.

Numerous variations on method 100B and the techniques described herein will be apparent in light of this disclosure. Recall that the techniques may be used to form a multitude of different transistor types and configurations. Although the techniques are primarily depicted and described herein in the context of employing non-selectively deposited S/D material for both of the S/D regions of a given transistor, the present disclosure is not intended to be so limited, as the techniques may be used to benefit only one S/D region of a given transistor, and not the other, in some embodiments. Numerous variations and configurations will be apparent in light of the present disclosure.

Example System

FIG. 4 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit (IC) including at least one transistor, the IC including: a channel region; a gate structure at least above the channel region; a source region adjacent the channel region, the source region including monocrystalline semiconductor material and a top surface; a drain region adjacent the channel region, the drain region including monocrystalline semiconductor material and a top surface; a first isolation structure adjacent the source region, the first isolation structure including insulator material and a top surface, wherein the top surface of the first isolation structure is at least 10 nanometers (nm) higher than the top surface of the source region; a second isolation structure adjacent the source region such that the source region is between the first and second isolation structures, the second isolation structure including insulator material and a top surface, wherein the top surface of the second isolation structure is at least 10 nm higher than the top surface of the source region; and amorphous or polycrystalline semiconductor material directly on the first isolation structure, the amorphous or polycrystalline semiconductor material also above and directly on the monocrystalline material included in the source region.

Example 2 includes the subject matter of Example 1, wherein the drain region is also between the first and second isolation structures, and wherein the top surface of the first isolation structure is at least 10 nm higher than the top surface of the drain region and the top surface of the second isolation structure is at least 10 nm higher than the top surface of the drain region.

Example 3 includes the subject matter of Example 1 or 2, wherein the channel region is also between the first and second isolation structures.

Example 4 includes the subject matter of Example 1, further including: a third isolation structure adjacent the drain region, the third isolation structure including insulator material and a top surface, wherein the top surface of the third isolation structure is at least 10 nm higher than the top surface of the drain region; and a fourth isolation structure distinct from the third isolation structure and adjacent the drain region such that the drain region is between the third and fourth, the fourth isolation structure including insulator material and a top surface, wherein the top surface of the fourth isolation structure is at least 10 nm higher than the top surface of the drain region.

Example 5 includes the subject matter of any of Examples 1-4, wherein the top surface of the first isolation structure is at least 30 nm higher than the top surface of the source region and the top surface of the second isolation structure is at least 30 nm higher than the top surface of the source region.

Example 6 includes the subject matter of any of Examples 1-5, wherein the source region includes an upper portion including at least 5 times more dopant by concentration than a lower portion of the source region.

Example 7 includes the subject matter of any of Examples 1-6, further including: a source contact structure above the source region and in an insulator layer, the source contact structure in electrical contact with the source region and including at least one metal; and a drain contact structure above the drain region and in the insulator layer, the drain contact structure in electrical contact with the drain region and including at least one metal; wherein the first and second isolation structures are distinct from the insulator layer.

Example 8 includes the subject matter of any of Examples 1-7, further including additional insulator material below the first isolation structure such that the first isolation structure is on the additional insulator material, the additional insulator material also below the second isolation structure such that the second isolation structure is also on the additional insulator material, wherein the additional insulator material is different from the insulator material included in the first isolation structure and the additional insulator material is also different from the insulator material included in the second isolation structure.

Example 9 includes the subject matter of any of Examples 1-8, further including another source region adjacent the source region, wherein the first isolation structure is between the source region and the other source region.

Example 10 includes the subject matter of any of Examples 1-9, wherein the first and second isolation structures each include at least one of silicon, oxygen, nitrogen, carbon, hafnium, tantalum, and zirconium.

Example 11 includes the subject matter of any of Examples 1-10, wherein the second isolation structure is distinct from the first isolation structure.

Example 12 includes the subject matter of any of Examples 1-11, wherein at least one of the source and drain regions includes monocrystalline group IV semiconductor material.

Example 13 includes the subject matter of any of Examples 1-12, wherein at least one of the source and drain regions includes monocrystalline group III-V semiconductor material.

Example 14 includes the subject matter of any of Examples 1-13, wherein the at least one transistor includes at least one of the following configurations: planar, finned, finned field-effect transistor (FinFET), double-gate, tri-gate, nanowire, nanoribbon, and gate-all-around (GAA).

Example 15 includes the subject matter of any of Examples 1-14, wherein the at least one transistor is one of a metal-oxide-semiconductor field-effect transistor (MOSFET) and a tunnel field-effect transistor (TFET).

Example 16 includes the subject matter of any of Examples 1-15, wherein the at least one transistor is an n-channel transistor or a p-channel transistor.

Example 17 is a computing system including the subject matter of any of Examples 1-16.

Example 18 is an integrated circuit (IC) including at least one transistor, the IC including: a channel region; a gate structure at least above the channel region; a source region adjacent the channel region, the source region including monocrystalline semiconductor material and a top surface; a drain region adjacent the channel region, the drain region including monocrystalline semiconductor material and a top surface; a first fin adjacent the source region, the first fin including insulator material and a top surface, wherein the top surface of the first fin is at least 10 nanometers (nm) higher than the top surface of the source region; and a second fin distinct from the first fin and adjacent the source region such that the source region is between the first and second fins, the second fin including insulator material and a top surface, wherein the top surface of the second fin is at least 10 nm higher than the top surface of the source region.

Example 19 includes the subject matter of Example 18, wherein the drain region is also between the first and second fins, and wherein the top surface of the first fin is at least 10 nm higher than the top surface of the drain region and the top surface of the second fin is at least 10 nm higher than the top surface of the drain region.

Example 20 includes the subject matter of Example 18 or 19, wherein the channel region is also between the first and second fins.

Example 21 includes the subject matter of Example 18, further including: a third fin adjacent the drain region, the third fin including insulator material and a top surface, wherein the top surface of the third fin is at least 10 nm higher than the top surface of the drain region; and a fourth fin distinct from the third fin and adjacent the drain region such that the drain region is between the third and fourth, the fourth fin including insulator material and a top surface, wherein the top surface of the fourth fin is at least 10 nm higher than the top surface of the drain region.

Example 22 includes the subject matter of any of Examples 18-21, wherein the top surface of the first fin is at least 30 nm higher than the top surface of the source region and the top surface of the second fin is at least 30 nm higher than the top surface of the source region.

Example 23 includes the subject matter of any of Examples 18-22, wherein the source region includes an upper portion including at least 5 times more dopant by concentration than a lower portion of the source region.

Example 24 includes the subject matter of any of Examples 18-23, further including: a source contact structure above the source region and in an insulator layer, the source contact structure in electrical contact with the source region and including at least one metal; and a drain contact structure above the drain region and in the insulator layer, the drain contact structure in electrical contact with the drain region and including at least one metal; wherein the first and second fins are distinct from the insulator layer.

Example 25 includes the subject matter of any of Examples 18-24, further including additional insulator material below the first fin such that the first fin is on the additional insulator material, the additional insulator material also below the second fin such that the second fin is also on the additional insulator material, wherein the additional insulator material is different from the insulator material included in the first fin and the additional insulator material is also different from the insulator material included in the second fin.

Example 26 includes the subject matter of any of Examples 18-25, further including another source region adjacent the source region, wherein the first fin is between the source region and the other source region.

Example 27 includes the subject matter of any of Examples 18-26, wherein the first and second fins each include at least one of silicon, oxygen, nitrogen, carbon, hafnium, tantalum, and zirconium.

Example 28 includes the subject matter of any of Examples 18-27, further including amorphous or polycrystalline semiconductor material directly on the first fin.

Example 29 includes the subject matter of any of Examples 18-28, wherein at least one of the source and drain regions includes monocrystalline group IV semiconductor material.

Example 30 includes the subject matter of any of Examples 18-29, wherein at least one of the source and drain regions includes monocrystalline group III-V semiconductor material.

Example 31 includes the subject matter of any of Examples 18-30, wherein the at least one transistor includes at least one of the following configurations: planar, finned, finned field-effect transistor (FinFET), double-gate, tri-gate, nanowire, nanoribbon, and gate-all-around (GAA).

Example 32 includes the subject matter of any of Examples 18-31, wherein the at least one transistor is one of a metal-oxide-semiconductor field-effect transistor (MOSFET) and a tunnel field-effect transistor (TFET).

Example 33 includes the subject matter of any of Examples 18-32, wherein the at least one transistor is an n-channel transistor or a p-channel transistor.

Example 34 is a mobile computing system including the IC of any of Examples 18-33.

Example 35 is a method of forming an integrated circuit (IC) including at least one transistor, the method including: forming a gate structure at least above a channel region, wherein the channel region is adjacent a source region and the channel region is also adjacent a drain region; forming a first isolation structure adjacent the source region, the first isolation structure including insulator material and a top surface; forming a second isolation structure adjacent the source region such that the source region is between the first and second isolation structures, the second isolation structure including insulator material and a top surface; and non-selectively depositing semiconductor material, wherein a portion of the non-selectively deposited semiconductor material is in the source region.

Example 36 includes the subject matter of Example 35, further including depositing, planarizing, and recessing hardmask material over the non-selectively deposited semiconductor material, such that the hardmask material remains over the source region.

Example 37 includes the subject matter of Example 36, further including etching the non-selectively deposited semiconductor material selective to the hardmask material.

Example 38 includes the subject matter of Example 37, further including etching the hardmask material selective to the non-selectively deposited semiconductor material.

Example 39 includes the subject matter of any of Examples 35-38, wherein the first and second isolation structures are formed prior to forming the gate structure.

Example 40 includes the subject matter of any of Examples 35-38, wherein the first and second isolation structures are formed after forming the gate structure.

Example 41 includes the subject matter of any of Examples 35-40, wherein the non-selectively deposited semiconductor material is formed on other semiconductor material in the source region.

Example 42 includes the subject matter of Example 41, wherein the non-selectively deposited semiconductor material includes at least 5 times more dopant by concentration than the other semiconductor material.

Example 43 includes the subject matter of any of Examples 35-42, wherein the gate structure is formed using gate first processing.

Example 44 includes the subject matter of any of Examples 35-42, wherein the gate structure is formed using gate last processing that employs a dummy gate structure.

Example 45 includes the subject matter of Example 44, further including converting the channel region to one or more nanowires after removing the dummy gate structure.

Example 46 includes the subject matter of any of Examples 35-45, further including selectively depositing semiconductor material in the source region, such that the selectively deposited semiconductor material does not significantly form from exposed insulator surfaces, wherein the selectively deposited semiconductor material is formed prior to forming the non-selectively deposited semiconductor material.

Example 47 includes the subject matter of any of Examples 35-46, further including forming a source contact above the source region and forming a drain contact above the drain region, wherein the source and drain contacts each include metal material.

Example 48 includes the subject matter of any of Examples 35-47, wherein the at least one transistor includes at least one of the following configurations: planar, finned, finned field-effect transistor (FinFET), double-gate, tri-gate, nanowire, nanoribbon, and gate-all-around (GAA).

Example 49 includes the subject matter of any of Examples 35-48, wherein the at least one transistor is one of a metal-oxide-semiconductor field-effect transistor (MOSFET) and a tunnel field-effect transistor (TFET).

Example 50 includes the subject matter of any of Examples 35-49, wherein the at least one transistor is an n-channel transistor or a p-channel transistor.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC), comprising:
 a semiconductor region;
 a gate structure at least above the semiconductor region;
 a source region adjacent the semiconductor region, the source region including monocrystalline semiconductor material and a top surface;
 a drain region adjacent the semiconductor region, the drain region including monocrystalline semiconductor material and a top surface;
 a first isolation structure adjacent the source region, the first isolation structure including insulator material and a top surface, wherein the top surface of the first isolation structure is at least 10 nanometers (nm) higher than the top surface of the source region;
 a second isolation structure adjacent the source region such that the source region is between the first and second isolation structures, the second isolation structure including insulator material and a top surface, wherein the top surface of the second isolation structure is at least 10 nm higher than the top surface of the source region; and
 an amorphous or polycrystalline semiconductor material directly on the first isolation structure, the amorphous or polycrystalline semiconductor material also above and directly on the monocrystalline semiconductor material included in the source region.

2. The IC of claim 1, wherein the drain region is also between the first and second isolation structures, and wherein the top surface of the first isolation structure is at least 10 nm higher than the top surface of the drain region and the top surface of the second isolation structure is at least 10 nm higher than the top surface of the drain region.

3. The IC of claim 1, wherein the semiconductor region is also between the first and second isolation structures.

4. The IC of claim 1, further comprising:
 a third isolation structure adjacent the drain region, the third isolation structure including insulator material and a top surface, wherein the top surface of the third isolation structure is at least 10 nm higher than the top surface of the drain region; and
 a fourth isolation structure distinct from the third isolation structure and adjacent the drain region such that the drain region is between the third and fourth, the fourth isolation structure including insulator material and a top surface, wherein the top surface of the fourth isolation structure is at least 10 nm higher than the top surface of the drain region.

5. The IC of claim 1, wherein the top surface of the first isolation structure is at least 30 nm higher than the top surface of the source region and the top surface of the second isolation structure is at least 30 nm higher than the top surface of the source region.

6. The IC of claim 1, wherein the source region includes an upper portion including at least 5 times more dopant by concentration than a lower portion of the source region.

7. The IC of claim 1, further comprising:
 a source contact structure above the source region and in an insulator layer, the source contact structure in electrical contact with the source region and including at least one metal; and
 a drain contact structure above the drain region and in the insulator layer, the drain contact structure in electrical contact with the drain region and including at least one metal;
 wherein the first and second isolation structures are distinct from the insulator layer.

8. The IC of claim 1, further comprising an additional insulator material below the first isolation structure such that the first isolation structure is on the additional insulator material, the additional insulator material also below the second isolation structure such that the second isolation structure is also on the additional insulator material, wherein the additional insulator material is different from the insulator material included in the first isolation structure and the additional insulator material is also different from the insulator material included in the second isolation structure.

9. The IC of claim 1, further comprising an another source region adjacent the source region, wherein the first isolation structure is between the source region and the other source region.

10. The IC of claim 1, wherein the first and second isolation structures each includes at least one of silicon, oxygen, nitrogen, carbon, hafnium, tantalum, and zirconium.

11. The IC of claim 1, wherein the second isolation structure is distinct from the first isolation structure.

12. The IC of claim 1, wherein at least one of the source and drain regions includes monocrystalline group IV semiconductor material.

13. The IC of claim 1, wherein at least one of the source and drain regions includes monocrystalline group III-V semiconductor material.

14. The IC of claim 1, wherein the semiconductor region is part of a fin, and the gate structure on top and side surfaces of the fin.

15. The IC of claim 1, wherein semiconductor region comprises one or more nanowires or nanoribbons, and the gate structure wraps around the one or more nanowires or nanoribbons.

16. An integrated circuit (IC), comprising:
 a non-planar semiconductor region;
 a gate structure at least on top and sides of the non-planar semiconductor region;
 a source region adjacent the non-planar semiconductor region, the source region including monocrystalline semiconductor material and a top surface;
 a drain region adjacent the non-planar semiconductor region, the drain region including monocrystalline semiconductor material and a top surface;
 a first fin adjacent the source region, the first fin including insulator material and a top surface, wherein the top surface of the first fin is at least 10 nanometers (nm) higher than the top surface of the source region; and
 a second fin distinct from the first fin and adjacent the source region such that the source region is between the first and second fins, the second fin including insulator material and a top surface, wherein the top surface of the second fin is at least 10 nm higher than the top surface of the source region.

17. The IC of claim 16, wherein the drain region is also between the first and second fins, and wherein the top surface of the first fin is at least 10 nm higher than the top surface of the drain region and the top surface of the second fin is at least 10 nm higher than the top surface of the drain region, and the non-planar semiconductor region is also between the first and second fins.

18. The IC of claim 16, further comprising:
a third fin adjacent the drain region, the third fin including insulator material and a top surface, wherein the top surface of the third fin is at least 10 nm higher than the top surface of the drain region; and
a fourth fin distinct from the third fin and adjacent the drain region such that the drain region is between the third and fourth, the fourth fin including insulator material and a top surface, wherein the top surface of the fourth fin is at least 10 nm higher than the top surface of the drain region.

\* \* \* \* \*